United States Patent
Jo et al.

(10) Patent No.: US 9,601,642 B1
(45) Date of Patent: Mar. 21, 2017

(54) CZTSE-BASED THIN FILM AND METHOD FOR PREPARING THE SAME, AND SOLAR CELL USING THE SAME

(71) Applicant: EWHA UNIVERSITY—INDUSTRY COLLABORATION FOUNDATION, Seoul (KR)

(72) Inventors: William Jo, Seoul (KR); Gee-Yeong Kim, Seoul (KR)

(73) Assignee: Ewha University—Industry Collaboration Foundation, Seoul (KR)

( * ) Notice: Subject to any disclaimer, the term of this patent is extended or adjusted under 35 U.S.C. 154(b) by 0 days.

(21) Appl. No.: 15/093,155

(22) Filed: Apr. 7, 2016

Related U.S. Application Data

(63) Continuation of application No. PCT/KR2015/010351, filed on Sep. 30, 2015.

(51) Int. Cl.
  *H01L 31/032* (2006.01)
  *H01L 31/18* (2006.01)

(52) U.S. Cl.
  CPC .......... *H01L 31/0326* (2013.01); *H01L 31/18* (2013.01)

(58) Field of Classification Search
  CPC .. H01L 31/0326; H01L 31/0327; H01L 31/18
  USPC ........................................ 136/261, 264, 265
  See application file for complete search history.

(56) References Cited

U.S. PATENT DOCUMENTS

| | | | | |
|---|---|---|---|---|
| 8,097,885 B2 * | 1/2012 | Oike | .................. | H01L 21/02568 257/102 |
| 2011/0287573 A1 * | 11/2011 | Johnson | ................ | C01B 19/002 438/84 |
| 2012/0055554 A1 * | 3/2012 | Radu | ...................... | B82Y 30/00 136/264 |
| 2012/0060928 A1 * | 3/2012 | Johnson | .............. | C23C 18/1204 136/264 |
| 2012/0067408 A1 * | 3/2012 | Hotz | ................... | H01L 31/0322 136/255 |
| 2012/0100663 A1 * | 4/2012 | Bojarczuk | ........... | H01L 31/0326 438/73 |
| 2012/0279565 A1 * | 11/2012 | Mitzi | .................. | H01L 21/0237 136/256 |
| 2012/0280185 A1 | 11/2012 | Liao | | |
| 2012/0288987 A1 * | 11/2012 | Radu | ...................... | B82Y 30/00 438/95 |
| 2013/0037090 A1 * | 2/2013 | Bag | ..................... | H01L 31/0326 136/252 |

(Continued)

FOREIGN PATENT DOCUMENTS

| | | |
|---|---|---|
| KR | 10-2013-0016528 A | 2/2013 |
| KR | 10/1339874 B | 12/2013 |

OTHER PUBLICATIONS

Kim et al., "Bandgap-Graded $Cu_2Zn(Sn_{1-x}Ge_x)S_4$ Thin-Film Solar Cells Derived from Metal Chalcogenide Complex Ligand Capped Nanocrystals", American Chemical Society, Chemistry of Materials, vol. 26, pp. 3957-3965, Jun. 2, 2014.

(Continued)

*Primary Examiner* — Golam Mowla
(74) *Attorney, Agent, or Firm* — Riverside Law LLP

(57) ABSTRACT

The present invention relates to a CZTSe-based composite thin film, a method for preparing the CZTSe-based composite thin film, a solar cell using the CZTSe-based composite thin film, and a method for preparing the solar cell using the CZTSe-based composite thin film.

13 Claims, 18 Drawing Sheets

(56) References Cited

U.S. PATENT DOCUMENTS

| | | |
|---|---|---|
| 2013/0217175 A1 | 8/2013 | Chawla et al. |
| 2013/0217177 A1 | 8/2013 | Wong et al. |
| 2014/0096826 A1* | 4/2014 | Todorov .................. C08K 3/02 136/264 |
| 2014/0113403 A1 | 4/2014 | Van Duren et al. |
| 2014/0144500 A1* | 5/2014 | Cao ..................... H01L 21/0237 136/256 |
| 2014/0216555 A1* | 8/2014 | Aydil .................. H01L 31/0326 136/264 |
| 2014/0220728 A1 | 8/2014 | Hillhouse et al. |

OTHER PUBLICATIONS

International Search Report of PCT/KR2015/010351 dated Feb. 23, 2016.

* cited by examiner

CZTSE-BASED THIN FILM AND METHOD FOR PREPARING THE SAME, AND SOLAR CELL USING THE SAME

CROSS-REFERENCE TO RELATED APPLICATIONS

This application claims priority from PCT application no. PCT/KR15/010351, filed Sep. 30, 2015 and Korean patent application no. 10-2014-0130511, filed Sep. 29, 2014, each of which is hereby incorporated by reference in their entirety.

TECHNICAL FIELD

The present invention relates to a CZTSe-based composite thin film, a method for preparing the CZTSe-based composite thin film, a solar cell using the CZTSe-based composite thin film, and a method for preparing the solar cell using the CZTSe-based composite thin film.

BACKGROUND

Recently, the development of next-generation clean energy has become more important due to severe environmental pollution and depletion of fossil fuels. Particularly, it is expected that solar cells, which are devices capable of converting solar energy directly into electrical energy, will become an energy source capable of solving future energy problems since they generate little air pollution, their resources are inexhaustible and they have semi-permanent life time.

Such solar cells are classified into various types depending on a material used as a light absorbing layer. Silicon solar cells using silicon are most commonly used presently. However, the price of silicon has soared due to a recent deficient supply of silicon. Accordingly, there is a growing interest in thin-film solar cells. Since the thin-film solar cells are manufactured to have a thin thickness, the thin-film solar cells require less consumption of materials and are light, and, thus, have a wide range of applications. Studies on amorphous silicon, CdTe, and CIS ($CuInSe_2$, $CuIn_{1-x}Ga_xSe_2$, $CuIn_{1-x}Ga_xS_2$, etc.) have been actively conducted as materials of such thin-film solar cells. A CIS-based thin film is one of I-III-IV compound semiconductors, and particularly, a CIGS solar cell has the highest conversion efficiency (about 22.3%) out of thin-film solar cells prepared experimentally. However, in used therein is a rare element found in a relatively small amount of its resource, and the price thereof is on an upward trend due to the demand for ITO used in the display industry, which may constitute an obstacle to mass production. In order to solve this problem, compound semiconductors such as $Cu_2ZnSnSe_4$ (CZTSe) and $Cu_2ZnSnS_4$ (CZTS) have been actively researched to be used for the development of a low-price solar cell as alternatives to CIGS-based thin film materials by substituting abundant elements Zn and Sn for rare elements of In and Ga. The compound semiconductors are advantageous in preparing a high-efficiency solar cell suitable for the solar spectrum and expected simultaneously to solve other problems of the CIGS-based solar cells.

Meanwhile, Korean Patent No. 10-1339874 discloses a method for preparing a double-grading CZTS-based thin film.

DETAILED DESCRIPTION OF THE INVENTION

Problems to be Solved by the Invention

In view of the foregoing problems, one purpose of the present disclosure is to provide a CZTSe-based composite thin film, a method for preparing the CZTSe-based composite thin film, a solar cell using the CZTSe-based composite thin film, and a method for preparing the solar cell using the CZTSe-based composite thin film.

However, problems to be solved by the present disclosure are not limited to the above-described problems. Although not described herein, other problems to be solved by the present disclosure can be clearly understood by those skilled in the art from the following descriptions.

Means for Solving the Problems

In a first aspect of the present disclosure, there is provided a method for preparing a CZTSe-based composite thin film, including: forming a $Cu_2ZnSnSe_4$ thin film on a substrate; and forming a metal component M-containing layer on the $Cu_2ZnSnSe_4$ thin film, followed by annealing to form a $Cu_2Zn(Sn_{1-x},M_x)Se_4$ thin film; wherein, x is from 0.2 to 0.5 and the component M includes Ge and/or Si.

In a second aspect of the present disclosure, there is provided a CZTSe-based composite thin film including: a $Cu_2ZnSnSe_4$ thin film; and a $Cu_2Zn(Sn_{1-x},M_x)Se_4$ thin film formed on the $Cu_2ZnSnSe_4$ thin film; wherein, x is from 0.2 to 0.5 and the component M includes Ge and/or Si.

In a third aspect of the present disclosure, there is provided a method for preparing a solar cell using a CZTSe-based composite thin film, including: forming a back electrode on a substrate; and forming a light absorbing layer including a CZTSe-based composite thin film prepared by the method in accordance with the first aspect on the back electrode.

In a fourth aspect of the present disclosure, there is provided a solar cell using a CZTSe-based composite thin film, including: a substrate; a back electrode on the substrate; and a light absorbing layer including the CZTSe-based composite thin film in accordance with the second aspect formed on the back electrode.

Effect of the Invention

A CZTSe-based composite thin film in accordance with an embodiment of the present disclosure includes a $Cu_2ZnSnSe_4$ thin film and a $Cu_2Zn(Sn_{1-x},M_x)Se_4$ thin film (herein, x=0.2 to 0.5) on the $Cu_2ZnSnSe_4$ thin film. Thus, since a band gap on a front surface layer is higher, an open-circuit voltage is increased and factors of electron-hole recombination that impedes efficiency are reduced. Further, since a band gap on a back surface layer is high, an electron mobility is increased. Accordingly, the efficiency of a solar cell using the CZTSe-based composite thin film as a light absorbing layer can be improved.

In an embodiment of the present disclosure, when the CZTSe-based composite thin film further includes a $Cu_2ZnSn(Se,S)_4$ thin film below the $Cu_2ZnSnSe_4$ thin film, the CZTSe-based composite thin film may include thin films having three different band gaps. In this case, the CZTSe-based composite thin film is manufactured to have band gaps which are not simply increased or decreased but have a dual or triple slope and thus include a higher band gap at an upper part including a component M (Ge or Si), the lowest band gap at an intermediate part including Se only, and a high band gap at a lower part including S. The band gap slopes at the upper part and the intermediate part lead to absorb light in a broad wavelength region, and, thus, can improve the efficiency. Further, the band gap slopes at the intermediate part and the lower part lead to inhibit electron-hole recombination, and, thus, can contribute to improvement of the efficiency of a solar cell using the same.

In an embodiment of the present disclosure, the CZTSe-based composite thin film having various band gaps can lead to absorb the solar spectrum in various manners, and, thus, can improve the solar absorbance.

BEST MODE FOR CARRYING OUT THE INVENTION

Figure 1:
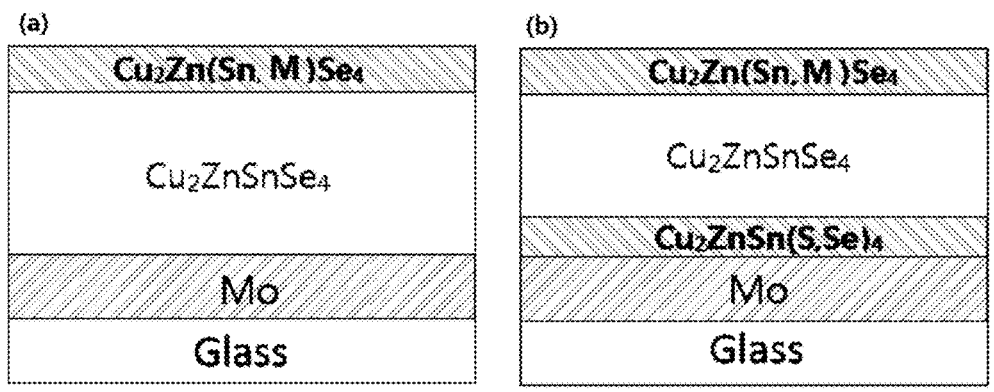
FIG. 1 is a schematic diagram illustrating a solar cell using a CZTSe-based composite thin film in accordance with an example of the present disclosure.

Hereinafter, embodiments of the present disclosure will be described in detail with reference to the accompanying drawings so that the present disclosure may be readily implemented by those skilled in the art. However, it is to be noted that the present disclosure is not limited to the embodiments but can be embodied in various other ways. In drawings, parts irrelevant to the description are omitted for the simplicity of explanation, and like reference numerals denote like parts through the whole document of the present disclosure.

Through the whole document of the present disclosure, the term "connected to" or "coupled to" that is used to designate a connection or coupling of one element to another element includes both a case that an element is "directly connected or coupled to" another element and a case that an element is "electronically connected or coupled to" another element via still another element.

Through the whole document of the present disclosure, the term "on" that is used to designate a position of one element with respect to another element includes both a case that the one element is adjacent to the another element and a case that any other element exists between these two elements.

Through the whole document of the present disclosure, the term "comprises or includes" and/or "comprising or including" used in the document means that one or more other components, steps, operation and/or existence or addition of elements are not excluded in addition to the described components, steps, operation and/or elements unless context dictates otherwise.

Through the whole document of the present disclosure, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party.

Through the whole document of the present disclosure, the term "step of" does not mean "step for".

Through the whole document of the present disclosure, the term "combinations of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through the whole document of the present disclosure, a phrase in the form "A and/or B" means "A or B, or A and B".

Hereinafter, embodiments of the present disclosure will be described, but the present disclosure may not be limited thereto.

In a first aspect of the present disclosure, there is provided a method for preparing a CZTSe-based composite thin film, including: forming a $Cu_2ZnSnSe_4$ thin film on a substrate; and forming a metal component M-containing layer on the $Cu_2ZnSnSe_4$ thin film, followed by annealing to form a $Cu_2Zn(Sn_{1-x},M_x)Se_4$ thin film; wherein, x is from 0.2 to 0.5 and the component M includes Ge and/or Si.

In the $Cu_2Zn(Sn_{1-x},M_x)Se_4$ thin film (herein, x=0.2 to 0.5), it is found that when x is in the range of from 0.2 to 0.5, a band gap is increased from about 1.15 eV to about 1.4 eV and optimized to improve a voltage and reduce a current loss. It is determined that when x is higher than 0.5, a voltage may be increased but a current loss occurs due to a high band gap, and when the content of M is higher than that of Sn, the probability of semiconductor defects may be increased, which may have a negative effect on the efficiency. By way of example, CZTS (including S only without Se) has a band gap of 1.5 eV in the case of $CZT(S_{1-x},Se_x)_4$ (x=0). A high band gap on a front surface may cause a current loss. Therefore, adjustment of a band gap using Ge may have a positive effect to the efficiency. If S is introduced to CZTSe, a valence band level is decreased, and, thus, a band gap is increased. If Ge is introduced, a conduction band level is increased, and, thus, a band gap is increased. Such adjustment of a band gap can reduce electron-hole recombination and thus contribute to improvement of the efficiency.

In an embodiment of the present disclosure, the substrate may include a metal or metal sulfide, but may not be limited thereto.

In an embodiment of the present disclosure, the $Cu_2ZnSnSe_4$ thin film may be formed by co-evaporating a precursor including Cu, Zn, Sn, and Se, or by forming a precursor thin film by depositing a Cu-containing precursor, a Zn-containing precursor, and a Sn-containing precursor, followed by performing selenization of the precursor thin film, but may not be limited thereto.

In an embodiment of the present disclosure, the $Cu_2ZnSnSe_4$ thin film may be prepared using a solution process, but may not be limited thereto.

In an embodiment of the present disclosure, the co-evaporation may be performed at a temperature of the substrate in the range of from about 300° C. to about 600° C. under a deposition pressure in the range of from about $5\times10^{-6}$ torr to about $5\times10^{-5}$ torr for from about 40 minutes to about 90 minutes, but may not be limited thereto. By way of example, a temperature of the substrate may be in the range of from about 300° C. to about 600° C., from about 300° C. to about 500° C., from about 300° C. to about 400° C., from about 400° C. to about 600° C., from about 400° C. to about 500° C., or from about 500° C. to about 600° C., but may not be limited thereto.

In an embodiment of the present disclosure, when the $Cu_2ZnSnSe_4$ thin film is formed, the method may include forming the Cu/Zn/Sn thin film, followed by performing a selenization process within a thin film forming chamber or a separate furnace, but may not be limited thereto. The selenization process may improve the density and crystallinity of the thin film, but may not be limited thereto.

In an embodiment of the present disclosure, the selenization process is a process for introducing Se onto the thin film using a Se-containing precursor. To be specific, there are, but not limited to, a method of introducing Se by evaporating and diffusing a Se metal source or a method of introducing Se by using $H_2Se$ gas phase source. The selenization process may be performed at a temperature of the substrate in the range of from about 300° C. to about 600° C. under a deposition pressure of from about $5\times10^{-6}$ torr to about $5\times10^{-5}$ torr for from about 10 minutes to about 30 minutes, but may not be limited thereto. By way of example, during the selenization process, a temperature of the substrate may be in the range of from about 300° C. to about 600° C., from about 300° C. to about 500° C., from about 300° C. to about 400° C., from about 400° C. to about 600° C., from about 400° C. to about 500° C., or from about 500° C. to about 600° C., but may not be limited thereto.

In an embodiment of the present disclosure, the selenization process may be performed within a separate quartz furnace in a range of from about 300° C. to about 600° C., but may not be limited thereto. By way of example, a temperature of the quartz furnace may be in the range of from about 300° C. to about 600° C., from about 300° C. to about 500° C., from about 300° C. to about 400° C., from about 400° C. to about 600° C., from about 400° C. to about 500° C., or from about 500° C. to about 600° C., but may not be limited thereto.

In an embodiment of the present disclosure, if the $Cu_2ZnSnSe_4$ thin film is formed by co-evaporating a precursor including Cu, Zn, Sn, and Se, a CZTSe thin film may be prepared using a Cu—Se, ZnSe, Sn—Se, Cu—Sn—Se, Cu—Sn—Se, Cu—Sn, Cu—Zn, Zn—Sn, and/or $Cu_2ZnSnSe_4$ (CZTSe) precursor such that all of Cu, Zn, Sn, and Se are included on a metal substrate. By way of example, a CZTSe thin film may be prepared using one to three combinations of the above-described precursors by the co-evaporation method such that all of Cu, Zn, Sn, and Se are included, but may not be limited thereto.

In an embodiment of the present disclosure, a metal precursor may be prepared by co-evaporating (Cu, Zn, and Sn at the same time, and/or Cu, Zn, and SnSe at the same time). By way of example, a CZTSe may be prepared by co-evaporating Cu—Zn—Sn followed by performing selenization, co-evaporating Cu—Zn—Sn—Se, co-evaporating Cu—Zn—SnSe followed by performing selenization, or co-evaporating Cu—Zn—SnSe—Se.

In an embodiment of the present disclosure, if the $Cu_2ZnSnSe_4$ thin film is formed by forming a precursor thin film by depositing a Cu-containing precursor, a Zn-containing precursor, and a Sn-containing precursor, followed by performing selenization, the precursor thin film may be deposited one or more times in order of Sn/Zn/Cu, Sn/Cu/Zn, Zn/Cu/Sn, Zn/Sn/Cu, Cu/Sn/Zn, or Cu/Zn/Sn, but may not be limited thereto.

In an embodiment of the present disclosure, each of the Sn, Zn, and Cu layers included in the precursor thin film may be formed to a thickness of from about 100 nm to about 1,800 nm, but may not be limited thereto. By adjusting the thickness of each layer, it may be possible to adjust a composition of the CZTSe-based thin film according to the present disclosure, but may not be limited thereto. By adjusting the composition, it may be possible to adjust a size of a grain growing when the thin film is formed, but may not be limited thereto. By way of example, each of the Sn, Zn, and Cu layers included in the precursor thin film may be formed to a thickness of from about 100 nm to about 1,800 nm, from about 300 nm to about 1,800 nm, from about 600 nm to about 1,800 nm, from about 900 nm to about 1,800 nm, from about 1,200 nm to about 1,800 nm, from about 1,500 nm to about 1,800 nm, from about 300 nm to about 1,500 nm, from about 600 nm to about 1,500 nm, from about 900 nm to about 1,500 nm, from about 1,200 nm to about 1,500 nm, from about 300 nm to about 1,200 nm, from about 600 nm to about 1,200 nm, from about 900 nm to about 1,200 nm, from about 300 nm to about 900 nm, from about 600 nm to about 900 nm, or from about 300 nm to about 600 nm, but may not be limited thereto.

In an embodiment of the present disclosure, the Sn, Zn, and Cu layers included in the precursor thin film may be formed at a temperature of the substrate in the range of from about room temperature to about 600° C. under a deposition pressure of from about $5\times10^{-6}$ torr to about $5\times10^{-5}$ torr, but may not be limited thereto. By way of example, when the Sn, Zn, and Cu layers are formed, a temperature of the substrate may be in the range of from about room temperature to about 600° C., from about room temperature to about 500° C., from about room temperature to about 400° C., from about room temperature to about 300° C., from about room temperature to about 200° C., from about room temperature to about 100° C., from about 100° C. to about 500° C., from about 100° C. to about 400° C., from about 100° C. to about 300° C., from about 100° C. to about 200° C., from about 200° C. to about 500° C., from about 200° C. to about 400° C., from about 200° C. to about 300° C., from about 300° C.

to about 500° C., from about 300° C. to about 400° C., or from about 400° C. to about 500° C., but may not be limited thereto.

In an embodiment of the present disclosure, before the $Cu_2ZnSnSe_4$ thin film is formed, a $Cu_2ZnSn(Se_{1-y},S_y)_4$ thin film (0≤y≤1) may be formed below the $Cu_2ZnSnSe_4$ thin film, by using SnS as a Sn-containing precursor and/or ZnS as a Zn-containing precursor; or by introducing a S-containing gas phase source, instead of using a Se precursor, by the same deposition method as performed to form the $Cu_2ZnSnSe_4$ thin film, but may not be limited thereto. By way of example, the S-containing gas phase source may include $H_2S$, but may not be limited thereto. By way of example, a $Cu_2ZnSnS_4$ thin film may be formed below the $Cu_2ZnSnSe_4$ thin film and a $Cu_2ZnSn(Se_{1-y},S_y)_4$ thin film (0<y<1) may be formed at an interface between these thin films.

In an embodiment of the present disclosure, a band gap of the $Cu_2ZnSnS_4$ thin film or $Cu_2ZnSn(Se_{1-y},S_y)_4$ thin film (0<y<1) may be higher than that of the $Cu_2ZnSnSe_4$ thin film.

In an embodiment of the present disclosure, as described above, a sulfurization process of reacting S included in a precursor; or additionally injecting a S-containing gas phase source may be performed within a furnace in a S atmosphere, but may not be limited thereto.

By way of example, the precursor thin film is formed on the substrate in order of Cu/Sn/Zn, Sn/Zn/Cu, or Sn/Cu/Zn, and when the precursor thin film is formed, SnS as a Sn-containing precursor and ZnS as a Zn-containing precursor are deposited. Therefore, the $Cu_2ZnSnS_4$ thin film and/or the $Cu_2ZnSn(Se_{1-y},S_y)_4$ thin film (0<y<1) may be formed below the $Cu_2ZnSnSe_4$ thin film, but may not be limited thereto.

In an embodiment of the present disclosure, the metal component M-containing layer may be prepared by depositing the metal M on a surface of the $Cu_2ZnSnSe_4$ thin film by a vacuum evaporation method; by decomposing and diffusing a metal component M-containing gas phase precursor; and/or by thermally treating the surface of the $Cu_2ZnSnSe_4$ thin film in the metal component M-containing atmosphere, but may not be limited thereto. By way of example, the metal component M may be diffused to about 100 nm from the surface of the $Cu_2ZnSnSe_4$ thin film to create band gap grading, but may not be limited thereto.

In an embodiment of the present disclosure, the $Cu_2ZnSnSe_4$ thin film may be formed to a thickness of from about 0.1 μm to about 3 μm, but may not be limited thereto. By way of example, the $Cu_2ZnSnSe_4$ thin film may be formed to a thickness of from about 0.1 μm to about 3 μm, from about 0.1 μm to about 2 μm, from about 0.1 μm to about 1 μm, from about 0.1 μm to about 0.5 μm, from about 0.5 μm to about 3 μm, from about 0.5 μm to about 2 μm, from about 0.5 μm to about 1 μm, from about 1 μm to about 3 μm, from about 1 μm to about 2 μm, or from about 2 μm to about 3 μm in order to absorb light, but may not be limited thereto.

In an embodiment of the present disclosure, the metal component M-containing layer may be formed to a thickness of from about 10 nm to about 1,500 nm on the surface of the $Cu_2ZnSnSe_4$ thin film, but may not be limited thereto. By way of example, the metal component M-containing layer may be formed to a thickness of from about 10 nm to about 1,500 nm, from about 10 nm to about 1,000 nm, from about 10 nm to about 500 nm, from about 10 nm to about 250 nm, from about 10 nm to about 100 nm, from about 250 nm to about 1,500 nm, from about 250 nm to about 1,000 nm, from about 250 nm to about 500 nm, from about 500 nm to about 1,500 nm, from about 500 nm to about 1,000 nm, or from about 1,000 nm to about 1,500 nm on the surface of the $Cu_2ZnSnSe_4$ thin film, but may not be limited thereto.

In an embodiment of the present disclosure, the metal component M-containing layer may be formed by depositing the component M on the surface of the $Cu_2ZnSnSe_4$ thin film at a temperature in the range of from about 250° C. to about 600° C. under a deposition pressure in the range of from about $5\times10^{-6}$ torr to about $5\times10^{-5}$ torr and then, the $Cu_2Zn(Sn,M)Se_4$ thin film may be formed by additionally performing annealing for from about 10 minutes to about 30 minutes at a temperature in the range of from about 200° C. to about 400° C., but may not be limited thereto.

By way of example, when the metal component M-containing layer is formed, a temperature may be in the range of from about 250° C. to about 600° C., from about 250° C. to about 500° C., from about 250° C. to about 400° C., from about 400° C. to about 600° C., from about 400° C. to about 500° C., or from about 500° C. to about 600° C. If the temperature is higher than 600° C., a glass substrate is melted, and if the temperature is lower than 250° C., the reaction does not occur.

By way of example, when the annealing is additionally performed, a temperature may be in the range of from about 200° C. to about 400° C., from about 200° C. to about 350° C., from about 200° C. to about 300° C., from about 200° C. to about 250° C., from about 250° C. to about 400° C., from about 250° C. to about 350° C., from about 250° C. to about 300° C., from about 300° C. to about 400° C., from about 300° C. to about 350° C., or from about 350° C. to about 400° C., but may not be limited thereto.

In a second aspect of the present disclosure, there is provided a CZTSe-based composite thin film including: a $Cu_2ZnSnSe_4$ thin film layer; and a $Cu_2Zn(Sn_{1-x},M_x)Se_4$ thin film formed on the $Cu_2ZnSnSe_4$ thin film; wherein, x is from 0.2 to 0.5 and the component M includes Ge and/or Si. All the descriptions relating to the first aspect of the present disclosure may be applied to a method for preparing the CZTSe-based composite thin film in accordance with the present aspect.

In an embodiment of the present disclosure, a $Cu_2ZnSn(Se_{1-y},S_y)_4$ thin film (0≤y≤1) may be further formed below the $Cu_2ZnSnSe_4$ thin film, but may not be limited thereto. By way of example, a $Cu_2ZnSnS_4$ thin film may be further formed below the $Cu_2ZnSnSe_4$ thin film and a $Cu_2ZnSn(Se_{1-y},S_y)_4$ thin film (0<y<1) may be formed at an interface between these thin films.

In an embodiment of the present disclosure, the $Cu_2Zn(Sn_{1-x},M_x)Se_4$ thin film may include $Cu_2Zn(Sn_{1-x},Ge_x)Se_4$ or $Cu_2Zn(Sn_{1-x},Si_x)Se_4$, and the $Cu_2ZnSn(Se_{1-y},S_y)_4$ thin film (0≤y≤1) may include $Cu_2ZnSnS_4$, but may not be limited thereto.

In an embodiment of the present disclosure, band gap energy of the $Cu_2ZnSnSe_4$ is about 1.0 eV, band gap energy of the $Cu_2ZnGeSe_4$ is about 1.4 eV, band gap energy of the $Cu_2ZnSiSe_4$ is about 2.4 eV, and band gap energy of the $Cu_2ZnSnS_4$ is about 1.5 eV. A band gap value of a CZTGSe thin film including Se may be adjusted depending on a composition ratio of Ge/(Ge+Sn) and Si/(Si+Sn). By way of example, $Cu_2ZnSnSe_4$, $Cu_2ZnSn_{0.8}Ge_{0.2}Se_4$, and $Cu_2ZnSn_{0.5}Ge_{0.5}Se_4$ may have band gaps of 1.0 eV, 1.15 eV, and 1.25 eV close to ideal band gaps, respectively, and $Cu_2Zn(Sn_{0.75},Si_{0.25})Se_4$, $Cu_2Zn(Sn_{0.5},Si_{0.5})Se_4$, and $Cu_2ZnSiSe_4$ can be adjusted to 1.3 eV, 1.5 eV, and 2.3 eV, respectively.

A band gap value of a $Cu_2ZnSnGeS_4$ thin film including S may be adjusted in the range of from 1.4 eV to 1.8 eV depending on a content of Ge. However, since the $Cu_2ZnSnGeS_4$ thin film has a large band gap, the CZTSe composite thin film in accordance with an embodiment of the present disclosure has an advantage of improving the efficiency when used as a light absorbing layer of a solar cell.

In an embodiment of the present disclosure, a band gap of the $Cu_2Zn(Sn_{1-x},Ge_x)Se_4$ thin film or the $Cu_2ZnSn(S,Se)_4$ thin film is higher than that of the $Cu_2ZnSnSe_4$ thin film. A band gap of $Cu_2ZnSnSe_4$ may be adjusted in the range of from 0.9 eV to 1.0 eV, a band gap of $Cu_2ZnSn(S_{0.5}Se_{0.5})_4$ may be adjusted to 1.2 eV, and a band gap of $Cu_2ZnSnS_4$ may be adjusted to 1.5 eV. Further, for example, a band gap of the $Cu_2Zn(Sn_{1-x},Ge_x)Se_4$ thin film may be higher than that of the $Cu_2ZnSnSe_4$ thin film, and may be in the range of higher than about 1.0 eV to lower than about 1.5 eV, and a band gap of $Cu_2Zn(Sn_{0.5}Ge_{0.5})Se_4$ may be adjusted to 1.15 eV and a band gap of $Cu_2Zn(Sn_{0.5}Si_{0.5})Se_4$ may be adjusted to 1.5 eV. Since $Cu_2ZnSiSe_4$ has a very high band gap of 2.3 eV or more, it is not suitable for a light absorbing layer. If it is used to create band gap grading, it may be desirable to set x in $Cu_2ZnSn_{1-x}Si_xSe_4$ to 0.5 or less. By way of example, a band gap of the $Cu_2Zn(Sn_{1-x},Si_x)Se_4$ thin film may be higher than that of the $Cu_2ZnSnSe_4$ thin film, and may be in the range of higher than about 1.0 eV to lower than about 2.4 eV, but may not be limited thereto.

In an embodiment of the present disclosure, in the CZTSe-based composite thin film in accordance with the present disclosure, since a band gap on a front surface layer is higher, an open-circuit voltage is increased and electron-hole recombination is reduced, and since a band gap on a back surface layer is high, an electron mobility is increased, which results in that and the efficiency of a solar cell is improved. If the CZTSe-based composite thin film further includes a $Cu_2ZnSn(Se,S)_4$ thin film below the $Cu_2ZnSnSe_4$ thin film, the CZTSe-based composite thin film may include thin films having three different band gaps. In this case, the CZTSe-based composite thin film is manufactured to have band gaps which are not simply increased or decreased but have a dual or triple slope and include the highest band gap at an upper part by introducing Ge or Si, the lowest band gap at an intermediate part including Se only, and a high band gap at a lower part including S. The band gap slopes at the upper part and the intermediate part lead to absorb light in a broad wavelength region, and, thus, can improve the efficiency. Further, the band gap slopes at the intermediate part and the lower part lead to inhibit electron-hole recombination, and, thus, can contribute to improvement of the efficiency of a solar cell using the same.

In a third aspect of the present disclosure, there is provided a method for preparing a solar cell using a CZTSe-based composite thin film, including: forming a back electrode on a substrate; and forming a light absorbing layer including a CZTSe-based composite thin film prepared by the method in accordance with the first aspect on the back electrode. All the descriptions relating to the first aspect and the second aspect of the present disclosure may be applied to the CZTSe-based composite thin film in accordance with the present aspect.

In an embodiment of the present disclosure, the CZTSe-based composite thin film includes a $Cu_2ZnSnSe_4$ thin film and the $Cu_2Zn(Sn_{1-x},M_x)Se_4$ thin film formed on the $Cu_2ZnSnSe_4$ thin film, and the component M includes Ge and/or Si.

In an embodiment of the present disclosure, the CZTSe-based composite thin film includes a $Cu_2ZnSnSe_4$ thin film and the $Cu_2Zn(Sn_{1-x},M_x)Se_4$ thin film formed on the $Cu_2ZnSnSe_4$ thin film, and a $Cu_2ZnSn(Se_{1-y},S_y)_4$ thin film ($0 \leq y \leq 1$) may be further formed below the $Cu_2ZnSnSe_4$ thin film, but may not be limited thereto. By way of example, a $Cu_2ZnSnS_4$ thin film may be further formed below the $Cu_2ZnSnSe_4$ thin film and a $Cu_2ZnSn(Se_{1-y},S_y)_4$ thin film ($0<y<1$) may be formed at an interface between these thin films.

In an embodiment of the present disclosure, the substrate may employ glass, metal foil, polyimide, and the like, but may not be limited thereto.

In an embodiment of the present disclosure, the back electrode may include Mo, but may not be limited thereto.

In a fourth aspect of the present disclosure, there is provided a solar cell using a CZTSe-based composite thin film, including: a substrate; a back electrode on the substrate; and a light absorbing layer including the CZTSe-based composite thin film in accordance with the second aspect formed on the back electrode.

The solar cell using a CZTSe-based composite thin film in accordance with the present aspect may be prepared by the method in accordance with the third aspect of the present disclosure. All the descriptions relating to the first aspect and the second aspect of the present disclosure may be applied to the CZTSe-based composite thin film in accordance with the present aspect.

In an embodiment of the present disclosure, the CZTSe-based composite thin film includes a $Cu_2ZnSnSe_4$ thin film and the $Cu_2Zn(Sn_{1-x},M_x)Se_4$ thin film formed on the $Cu_2ZnSnSe_4$ thin film, and the component M includes Ge and/or Si.

In an embodiment of the present disclosure, the CZTSe-based composite thin film includes a $Cu_2ZnSnSe_4$ thin film and the $Cu_2Zn(Sn_{1-y},M_x)Se_4$ thin film formed on the $Cu_2ZnSnSe_4$ thin film, and a $Cu_2ZnSn(Se_{1-y},S_y)_4$ thin film ($0 \leq y \leq 1$) may be further formed below the $Cu_2ZnSnSe_4$ thin film, but may not be limited thereto. By way of example, a $Cu_2ZnSnS_4$ thin film may be further formed below the $Cu_2ZnSnSe_4$ thin film and a $Cu_2ZnSn(Se_{1-y},S_y)_4$ thin film ($0<y<1$) may be formed at an interface between these thin films.

In an embodiment of the present disclosure, the solar cell using a CZTSe-based composite thin film according to the present disclosure includes the CZTSe-based composite thin film in which a band gap on a front surface layer is high, and, thus, an open-circuit voltage is increased and electron-hole recombination is reduced and a band gap on a back surface layer is high, and, thus, an electron mobility is increased. Thus, the efficiency of the solar cell is improved, but the present disclosure may not be limited thereto. Assuming that a solar cell using a conventional CZTSe thin film has the efficiency of about 3%, when grading is created using CZTGS, a band gap on a front surface is increased too much. Thus, it can be seen that an open-circuit voltage is improved but the efficiency is decreased due to a decrease in a short-circuit current and a fill factor. Meanwhile, it can be seen that CZTGSe achieves a voltage improvement and reduces a current loss, and, thus, achieves the efficiency of about 4% or more which is improved by about 33% as compared with the conventional CZTSe thin film. In particular, unlike S grading in CIGSSe, it has not yet been reported that S grading in CZTGSSe is achieved. If a surface treatment is performed using Ge and/or Si as described in the present example, it is possible to further improve device characteristics than the conventionally known efficiency. In this regard, S changes a valence band, whereas Ge changes a conduction band. Therefore, as described in an embodiment of the present disclosure, if a solar cell is optimized by creating band gap grading using Ge and/or Si, it is possible to achieve the efficiency of about 15% or more.

If a solar cell is optimized by creating band gap grading, it is possible to suppress reduction of electron-hole interface recombination and an efficiency loss caused by an electric field on a back surface through back grading and front grading of a conventional device. Thus, it is possible to achieve the efficiency of about 4% or more. In particular, unlike S grading in CIGSSE, it has not yet been reported that S grading in CZTGSSe is achieved. If a surface treatment is performed using Ge and/or Si as described in the present example, it is possible to further improve device characteristics than the conventionally known efficiency. In this regard, S changes a valence band, whereas Ge changes a conduction band. Therefore, as described in an embodiment of the present disclosure, if a solar cell is optimized by creating band gap grading using Ge and/or Si, it is possible to achieve the efficiency of about 15% or more.

Accordingly, as described in an embodiment of the present disclosure, if a solar cell is optimized by creating band gap grading using Ge and/or Si, it is possible to achieve the efficiency of about 15% or more.

Hereinafter, the present disclosure will be explained in detail with reference to examples. However, the following examples are provided only for understanding of the present disclosure, but the present disclosure is not limited thereto.

MODE FOR CARRYING OUT THE INVENTION

Example

Example 1

Preparation of $Cu_2ZnSnSe_4$ (CZTSe) Thin Film Using Co-Evaporation (1) Preparation of $Cu_2ZnSnSe_4$ Thin Film A CZTSe thin film was prepared on a metal substrate using $Cu_2ZnSnSe_4$ (Cu—Zn—Sn—Se precursor)(layer) including all of Cu, Zn, Sn, and Se.

When the thin film was deposited, a temperature was 500° C. and a deposition pressure was $1\times10^{-5}$ torr. The thin film was deposited for about 60 minutes. Finally, a $Cu_2ZnSnSe_4$ thin film was formed to a thickness of from 1,200 nm to 1,300 nm.

(2) Selenization of $Cu_2ZnSnSe_4$ Thin Film

After the $Cu_2ZnSnSe_4$ thin film was formed, selenization was additionally performed using a Se metal source for about 20 minutes in order to improve crystallinity of the thin film. In this case, the temperature was 500° C. and the pressure was $1\times10^{-5}$ torr as did in the above deposition.

Example 2

Preparation of $Cu_2ZnSnSe_4$ Thin Film Using a Layer-By-Layer Deposition (1) Preparation of $Cu_2ZnSnSe_4$ thin film A thin film was deposited in a layer-by-layer manner on a metal substrate using Cu metal, Zn metal and Sn metal sources by a vacuum evaporation method. In this case, a Cu/Zn/Sn layered thin film was formed in order of the above-described precursors. In the layered thin film, Sn was deposited as the lowermost layer, which is due to that if Sn is present at an upper part, a CZTSe thin film cannot be formed well due to Sn-loss. Further, the reason why Cu was deposited at the uppermost part is that it is possible to improve a grain size and it is easy to adjust a composition. Thus, the thin film was formed using the Cu/Zn/Sn layered structure. Each component layer was formed to a thickness of about 1,200 nm. A composition of the layered thin film was adjusted by adjusting a thickness of each layer. When the layered thin film was formed, a temperature of the substrate was about 500° C. and a deposition pressure was $1\times10^{-5}$ torr.

As described above, after the layered thin film including components Cu, Zn, and Sn was formed, selenization was performed to the layered thin film at a temperature of 500° C. under a deposition pressure of $1\times10^{-5}$ torr for about 20 minutes in order to improve crystallinity of the thin film. Finally, a $Cu_2ZnSnSe_4$ thin film was prepared.

(2) Preparation of $Cu_2ZnSnSe_4$ Thin Film (Selenization in a Separate Furnace)

Alternatively, in order to perform selenization to the prepared layered thin film including components Cu, Zn, and Sn, the $Cu_2ZnSnSe_4$ thin film was put into a quartz furnace and selenization was performed thereto at a temperature of 580° C. under a deposition pressure of $1\times10^{-3}$ torr for about 20 minutes. Through this process, grains of CZTSe were formed to a size of several hundreds nm to several μm or more. Solar absorption was improved by adjusting a grain size.

Example 3

Preparation of $Cu_2ZnSnSe_4$ Thin Film Formed on $Cu_2ZnSn(Se,S)_4$ Thin Film

A $Cu_2ZnSnSe_4$ thin film was prepared in the same manner as Example 1 or 2, but before the $Cu_2ZnSnSe_4$ thin film was prepared, a $Cu_2ZnSnS_4$ (CZTS) thin film was formed below the light absorbing layer using a SnS metal source, ZnS, and a Cu metal source, a CZTSe thin film was formed thereon (using the method of Examples 1 and 2) and then a CZTGSe thin film was formed by introducing Ge into a surface of the CZTSe thin film (see Example 4 to be described below), so that front band gap grading (CZTGSe thin film) and back band gap grading (CZTS thin film) were created.

Example 4

Preparation of $Cu_2Zn(Sn_{1-x},Ge_x)Se_4$ (CZTGSe) Thin Film

A $Cu_2Zn(Sn_{1-x},Ge_x)Se_4$ thin film was formed on a surface of the $Cu_2ZnSnSe_4$ thin film prepared in Example 1 to Example 3 by depositing Ge on the surface of the $Cu_2ZnSnSe_4$ thin film (see FIG. 1). To be specific, the Ge was deposited on the surface of the $Cu_2ZnSnSe_4$ thin film to a thickness of from 30 nm to 1,000 nm. In this case, the Ge was deposited at a temperature in the range of from 200° C. to 500° C. under a pressure in the range of from $5\times10^{-6}$ torr to $5\times10^{-5}$ torr for from about 10 minutes to about 30 minutes (5-minute intervals). Finally, a CZTSe-based thin film including the $Cu_2Zn(Sn_{1-x},Ge_x)Se_4$ thin film on the $Cu_2ZnSnSe_4$ thin film was formed. If a thickness of Ge was greater than 100 nm, a Sn-loss is worsened and an amount of Ge becomes greater than that of the CZTSe thin film, and, thus, it is difficult to form a proper thin film.

Figure 2:
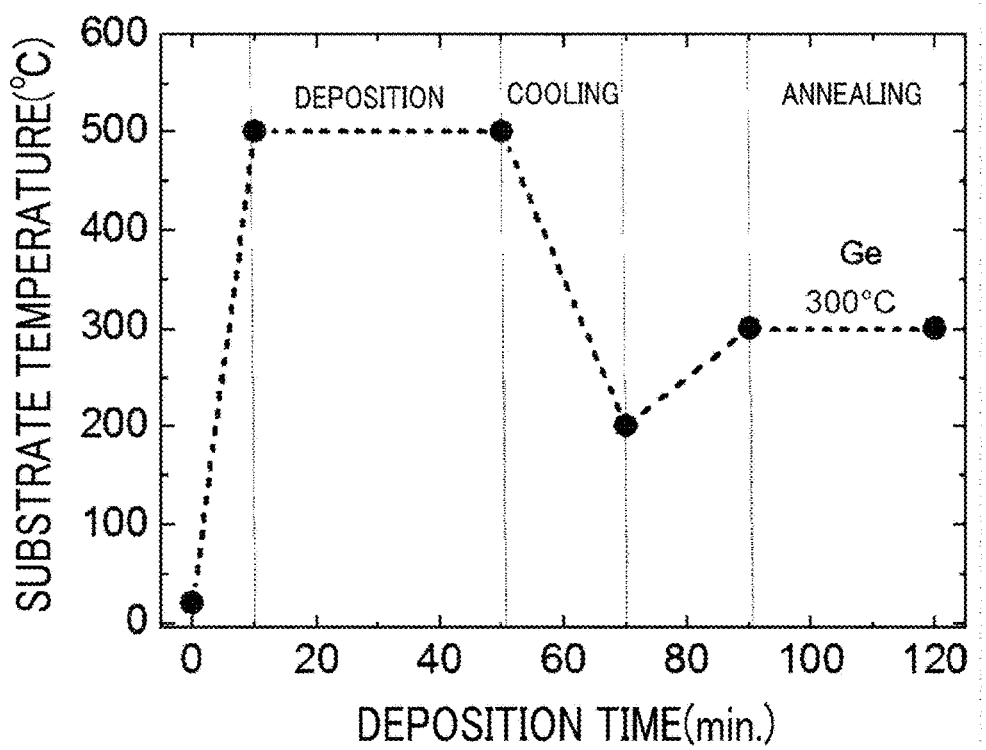
FIG. 2 is a graph showing temperature conditions according to a deposition time of a CZTSe-based composite thin film in accordance with an example of the present disclosure.

It is possible to adjust a composition of the CZTGSe thin film and a diffusion rate of Ge by adjusting a thickness of Ge and a heat treatment time. If a heat treatment condition for Ge is higher than 400° C., all of Sn forming CZTSe is lost and a proper thin film cannot be formed. Further, at 400° C. or higher, Ge is not deposited but lost immediately. Thus, a heat treatment temperature of 400° C. or less was applied. The CZTSe-based thin film had a structure of a $Cu_2ZnSnSe_4/Cu_2Zn(Sn_{1-x},Ge_x)Se_4$ thin film (see FIG. 1(a)) or $Cu_2ZnSn(Se_{1-y},S_y)_4/Cu_2ZnSnSe_4/Cu_2Zn(Sn_{1-x},Ge_x)Se_4$ thin film (see FIG. 1(b)). FIG. 2 is a graph showing temperature conditions according to a deposition time.

The following Table 1 shows a result of a heat treatment of the CZTGSe thin film performed at 300° C. to minimize loss of Sn and Ge and adjust a ratio of Ge/(Ge+Sn). In particular, a grain shape on the surface was adjusted by varying a heat treatment time, and a diffusion rate of Ge and a ratio of Ge/(Ge+Sn) were adjusted.

TABLE 1

| | Substance | Ge | Condition | Cu | Zn | Ge | Sn | Se | Cu/(Zn + Sn + Ge) | Zn/(Ge + Sn) | Ge/(Ge + Sn) |
|---|---|---|---|---|---|---|---|---|---|---|---|
| (a) 150 | CZTGSe | 100 nm | 300° C., 10 min | 20.54 | 21.41 | 6.01 | 7.86 | 44.19 | 0.58 | 1.54 | 0.43 |
| (b) 162 | CZTGSe | 100 nm | 300° C., 15 min | 16.95 | 18.81 | 3.85 | 14.63 | 45.77 | 0.45 | 1.02 | 0.21 |
| (c) 160 | CZTGSe | 100 nm | 300° C., 20 min | 21.31 | 17.87 | 7.43 | 10.07 | 43.31 | 0.60 | 1.02 | 0.42 |
| (d) 157 | CZTGSe | 100 nm | 300° C., 30 min | 18.50 | 12.44 | 15.72 | 15.44 | 37.91 | 0.42 | 0.40 | 0.50 |

Experimental Example 1

Field Emission Scanning Electron Microscopic (FE-SEM) Analysis

Figure 3:
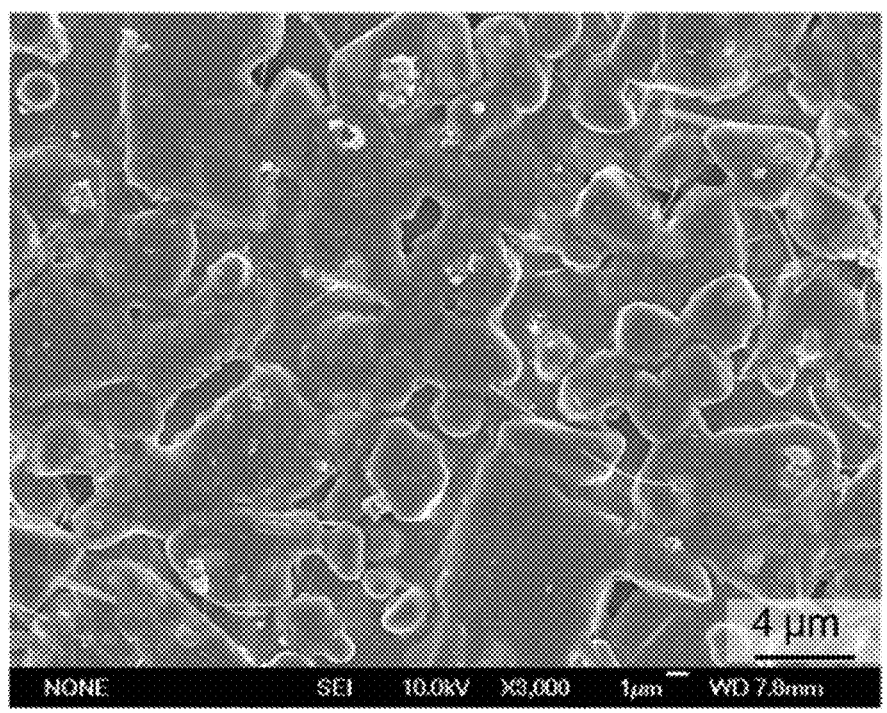
FIG. 3 and FIG. 4A to FIG. 4D are scanning electron microscopic images of a $Cu_2Zn(Sn,Ge)Se_4$ thin film in accordance with an example of the present disclosure.
Figure 4A:
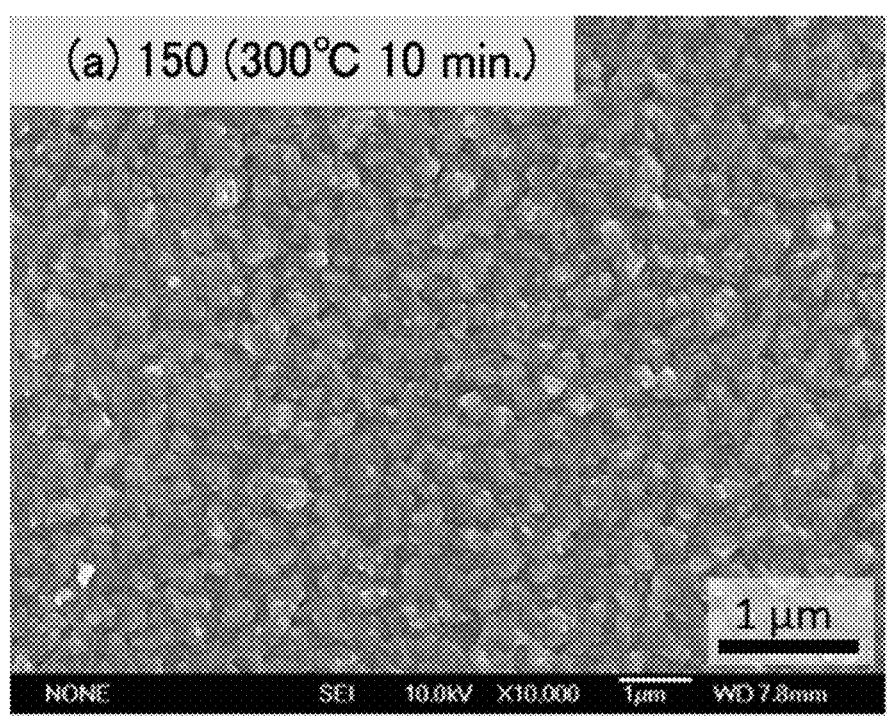
Figure 4B:
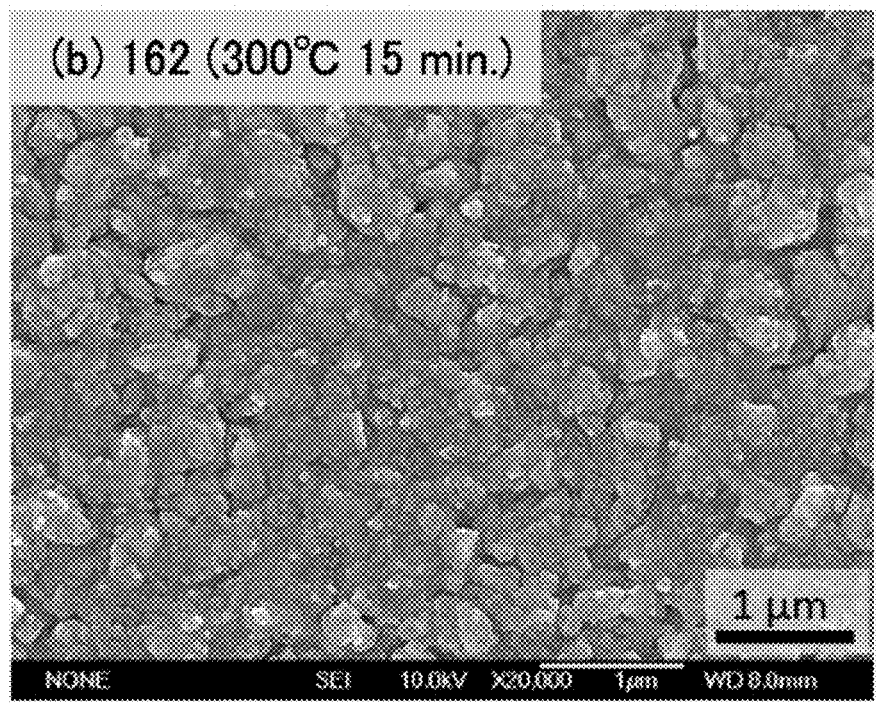
Figure 4C:
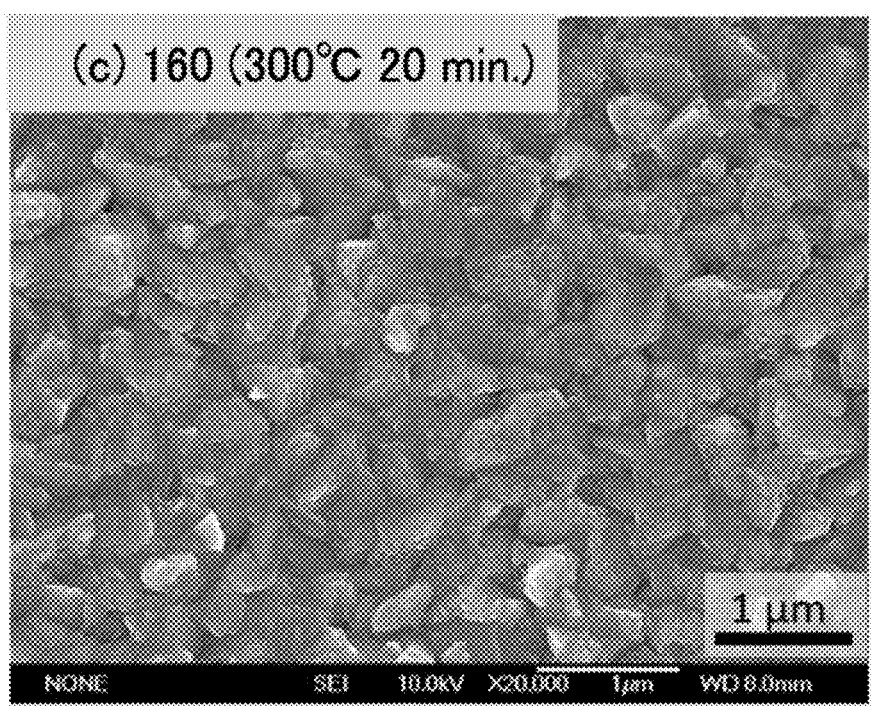
Figure 4D:
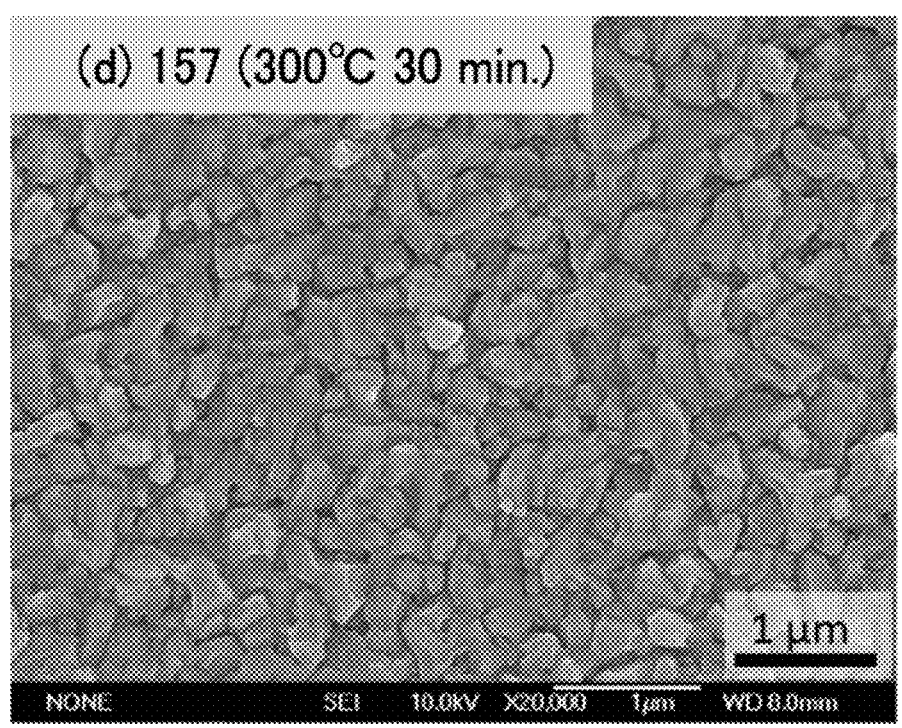

A FE-SEM analysis (JSM-6700F, acceleration voltage of 10 kV) was conducted to the $Cu_2Zn(Sn_{1-x},Ge_x)Se_4$ thin film formed on the surface of the $Cu_2ZnSnSe_4$ thin film prepared in Example 4. A result thereof was as shown in FIG. 3 and FIG. 4A to FIG. 4D. To be specific, as shown in FIG. 3, it was observed that grains of the $Cu_2Zn(Sn_{1-x},Ge_x)Se_4$ thin film were sufficiently grown and prepared to make it easy to improve light absorbance and transport electrons and holes.

Experimental Example 2

Measurement and Analysis of Band Gap

Figure 5:
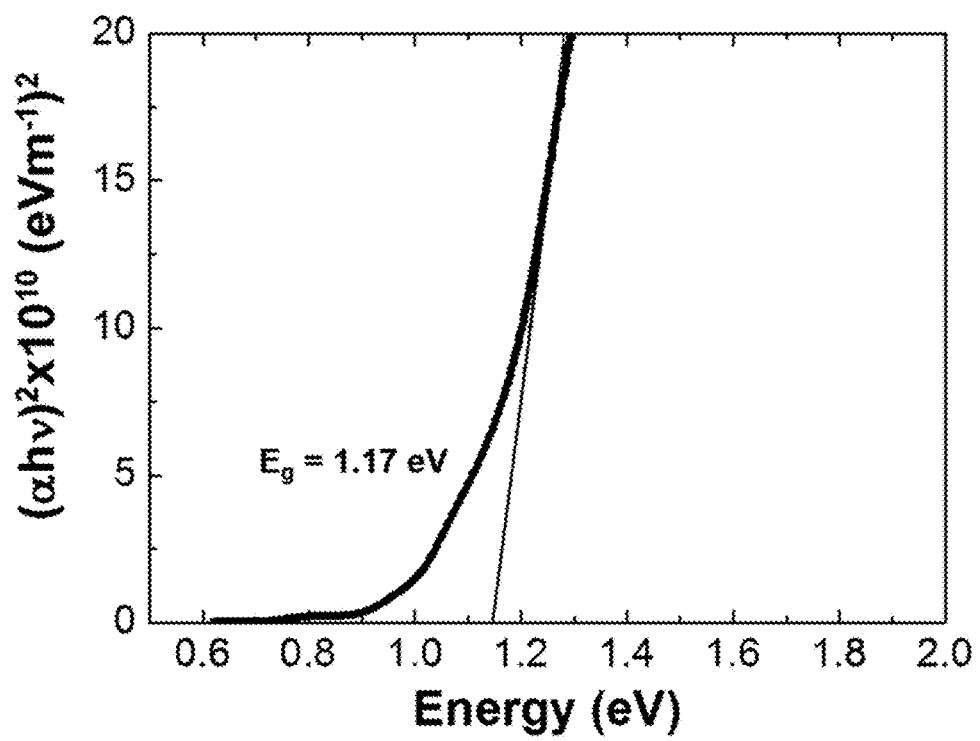
FIG. 5 is a graph showing a measurement result of a band gap of a $Cu_2Zn(Sn,Ge)Se_4$ thin film in accordance with an example of the present disclosure.

A band gap of the $Cu_2Zn(Sn_{1-x},Ge_x)Se_4$ thin film formed on the surface of the $Cu_2ZnSnSe_4$ thin film prepared in Example 4 was measured [Perkin-Elmer UV/VIS spectrometer (Lambda 750), wavelength range of from 200 nm to 1,200 nm]. A result thereof was as shown in FIG. 5. To be specific, FIG. 5 illustrates measured light transmission according to a wavelength, and a wavelength (i.e., corresponding to light energy) meeting an extrapolation line indicates a band gap of a substance.

Figure 6:
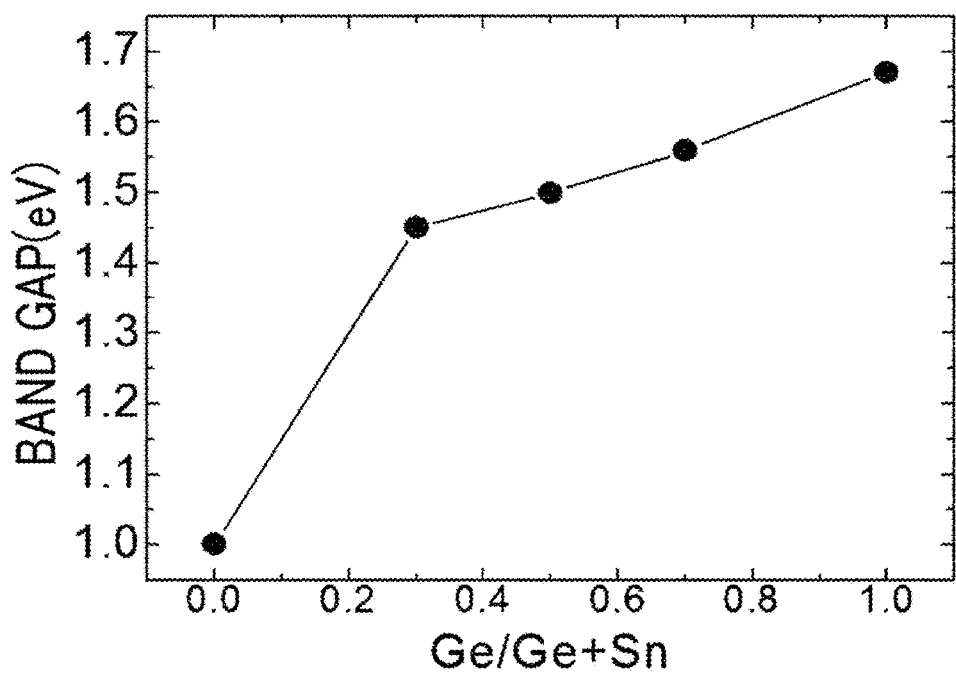
FIG. 6 is a graph showing a change in a band gap depending on an amount of Ge which substitutes for Sn in a $Cu_2Zn(Sn,Ge)Se_4$ thin film in accordance with an example of the present disclosure.

Further, a change in a band gap depending on an amount of Ge substituting for Sn in the $Cu_2Zn(Sn_{1-x},Ge_x)Se_4$ thin film was measured and shown in FIG. 6. It can be seen that as an amount of Ge substituting for Sn increases, a band gap also increases.

In case of the thin film prepared in Example 3, the CZTS thin film was formed below the CZTSe thin film in order to create back grading of the CZTSe thin film. Thus, when an electric field was formed within a light absorbing layer and electrons and holes were formed by solar light, the CZTS thin film acts to assist the electrons in moving well toward a back electrode due to a potential difference.

Figure 11:
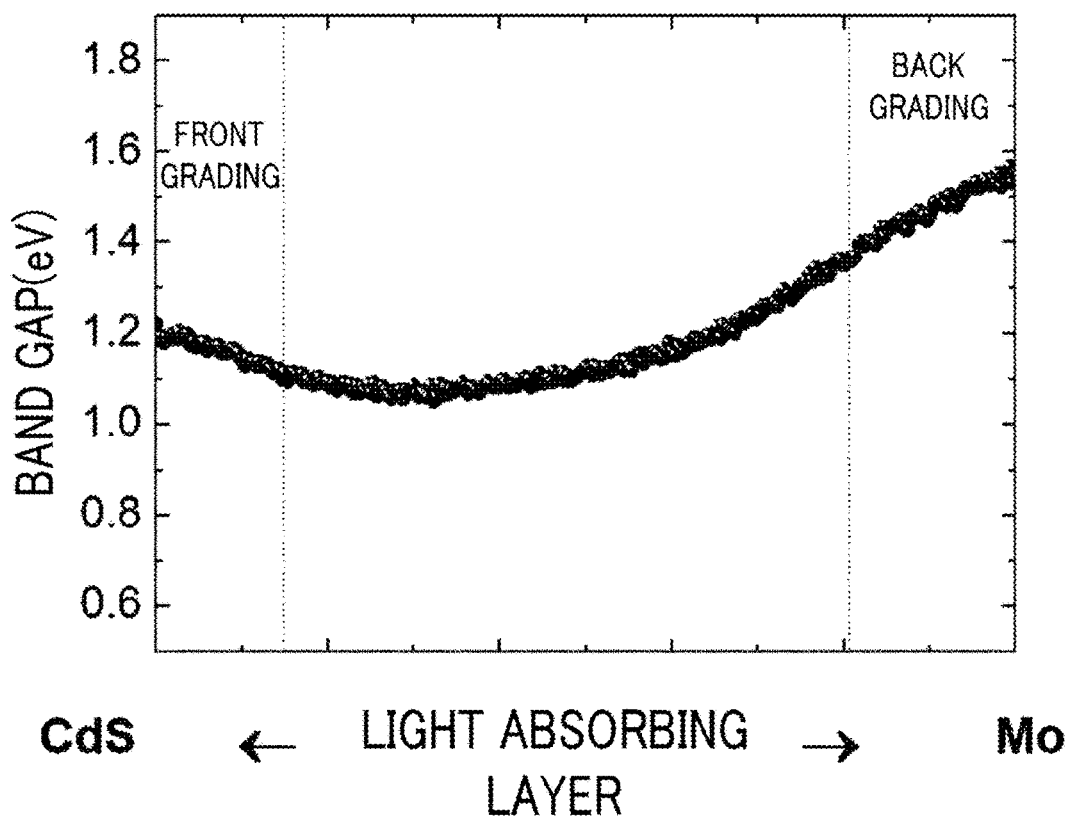
FIG. 11 is a graph showing band gap grading of a light absorbing layer of a CZTSe-based composite thin film in accordance with an example of the present disclosure.

In the thin film prepared in Example 4, Ge was introduced into the CZTSe thin film to create front grading and improve a band gap on a surface of a light absorbing layer, and, thus, an open-circuit voltage was improved. Therefore, a band offset was reduced at the time of interfacial bonding with a buffer layer formed on the light absorbing layer when a solar cell was prepared, thereby reducing electron-hole recombination. Therefore, it is possible to obtain the advantage in efficiency when using in the solar cell. In this regard, if the band bap is increased to 1.4 eV or more, a short-circuit current and a fill factor decrease, which may cause a loss of efficiency. Therefore, Ge grading needs to be created such that a band gap is formed in the range of 1.2 eV to 1.4 eV (see FIG. 11).

Figure 12:
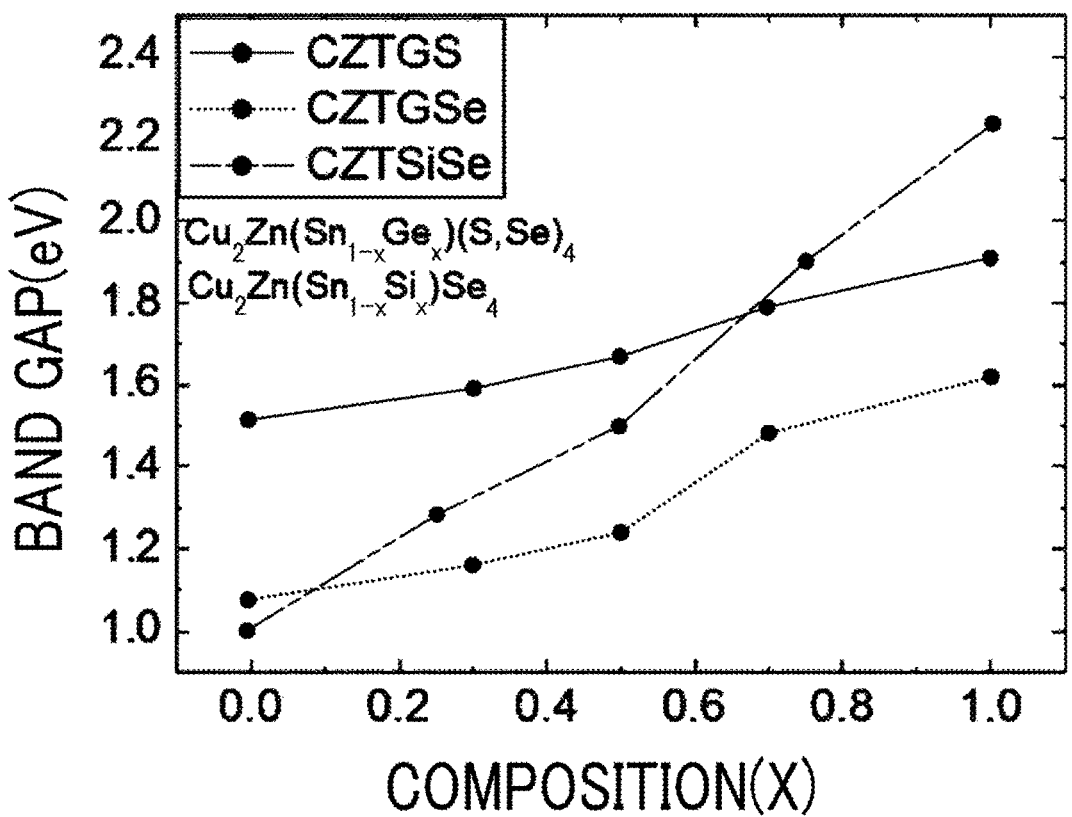
FIG. 12 is a graph showing a change in a band gap depending on a composition of a CZTSe-based composite thin film in accordance with an example of the present disclosure.

A thickness of the Ge grading is very important in determining the efficiency when using in the solar cell. As described above, if a band gap is higher than 1.4 eV in the front grading, a great loss of efficiency may occur due to a loss of a short-circuit current. Therefore, it is important to create grading with a band gap of 1.4 eV or less. Accordingly, x in $Cu_2Zn(Sn_{1-x},Ge_x)Se_4$ needs to be set in the range of from 0.2 to 0.5 and a graded depth needs not to exceed 100 nm (see FIG. 12).

Experimental Example 3

Measurement of Element Composition According to Depth

Figure 7:
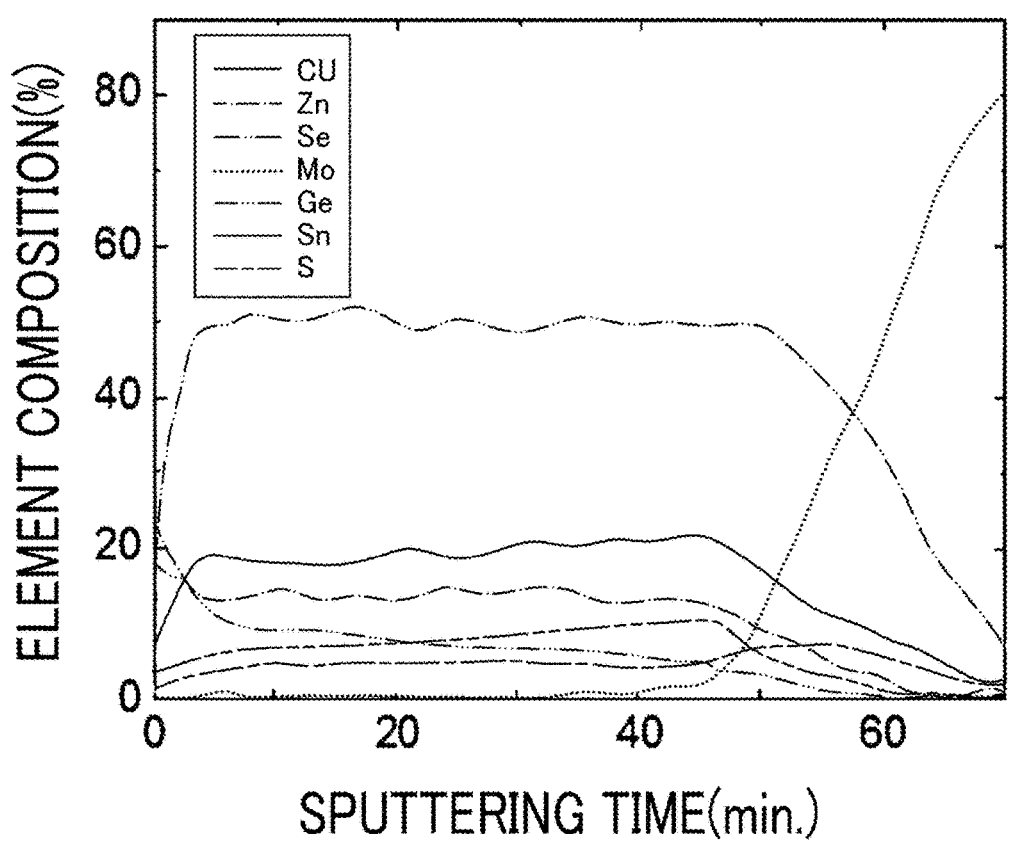
FIG. 7 is a graph showing a measurement result of an element composition while a CZTSe-based composite thin film in accordance with an example of the present disclosure is etched by sputtering.
Figure 8A:
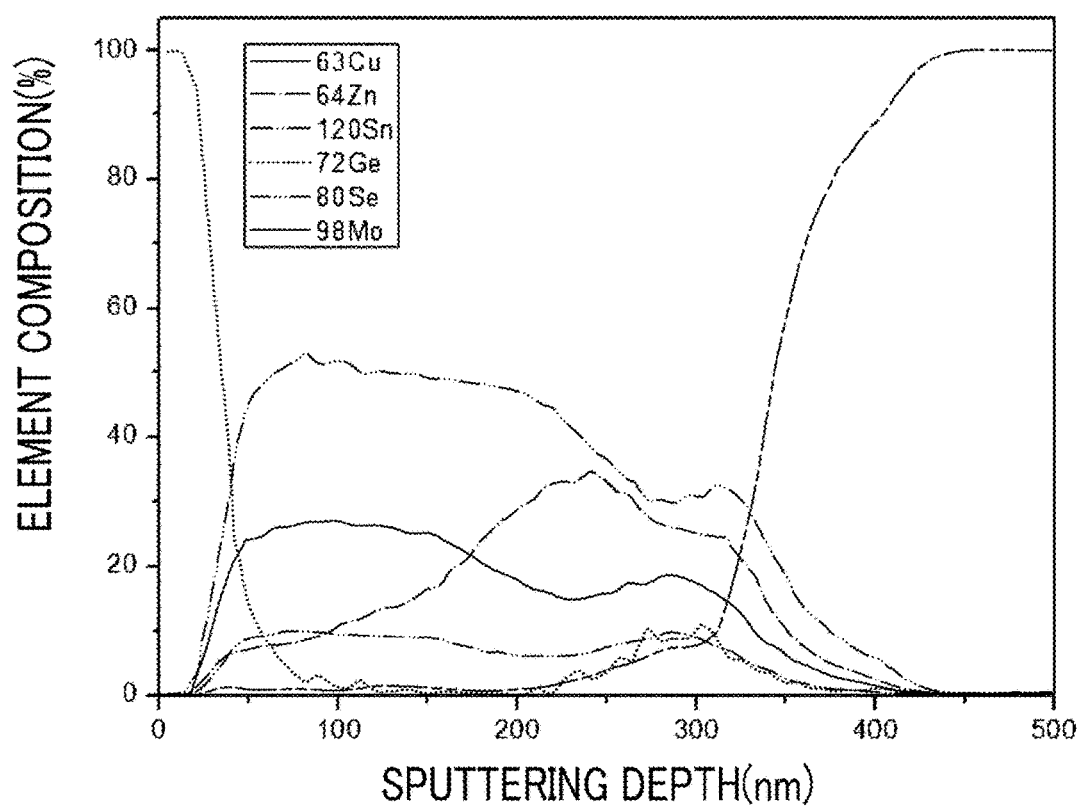
FIG. 8A to FIG. 8D show measurement results of an element composition according to a depth of a CZTSe-based composite thin film in accordance with an example of the present disclosure.
Figure 8B:
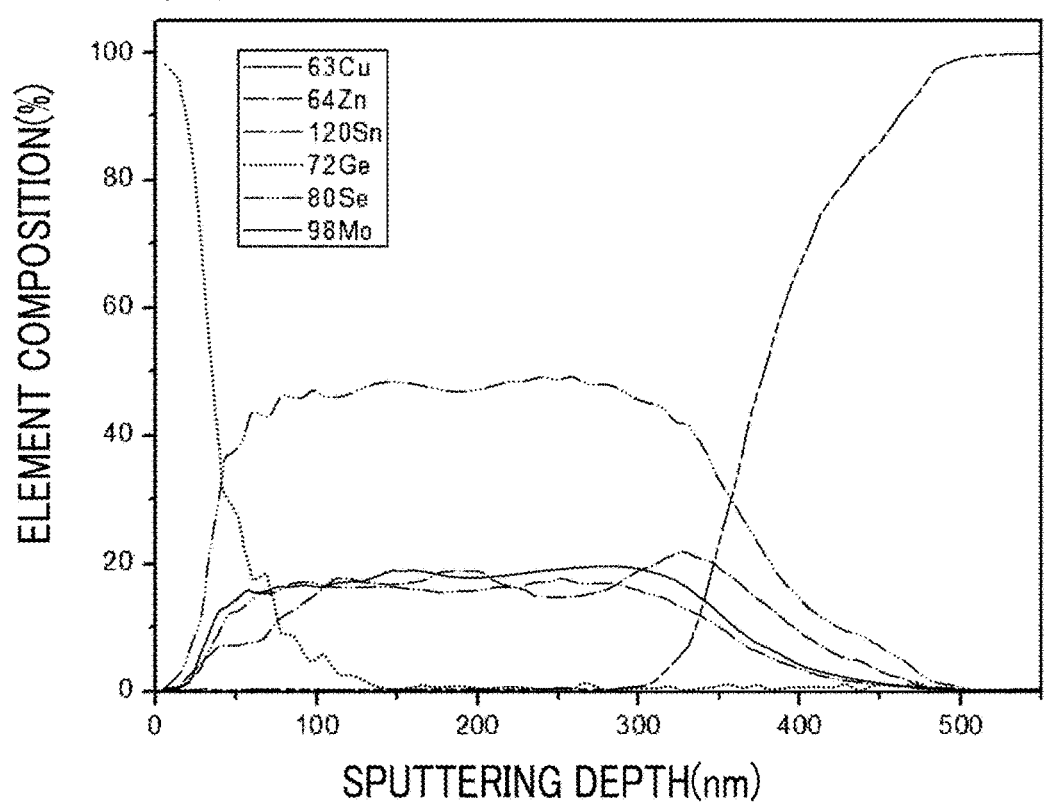
Figure 8C:
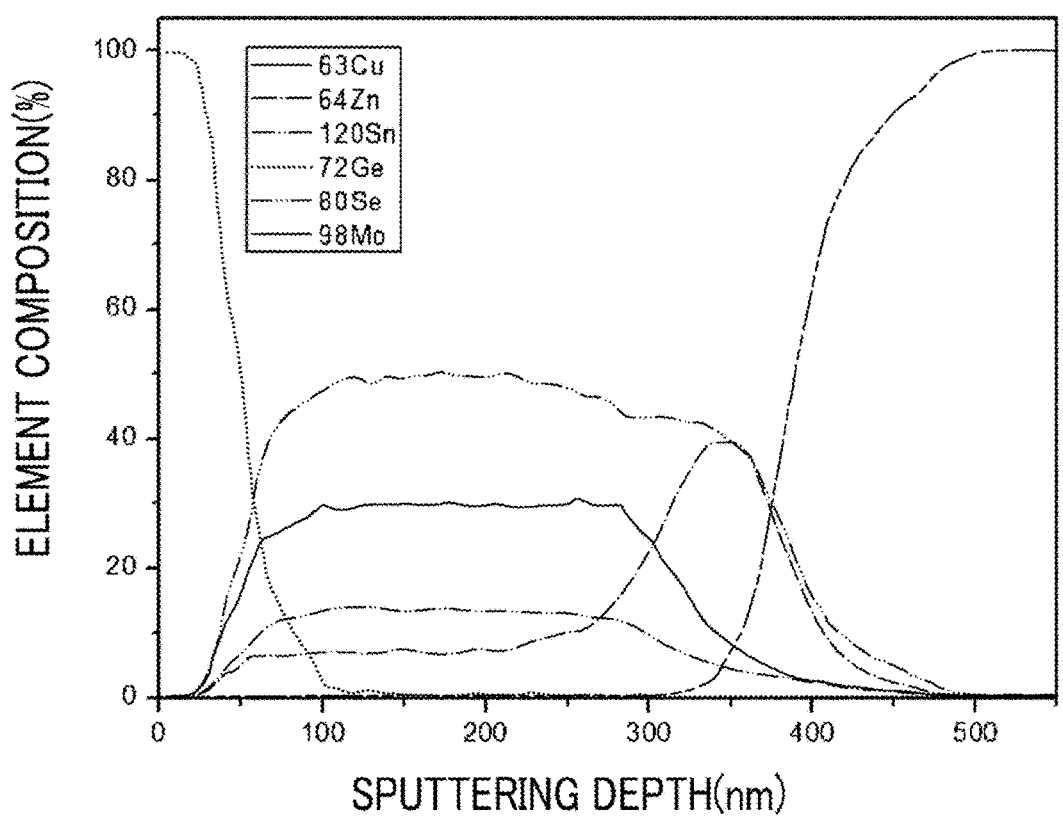
Figure 8D:
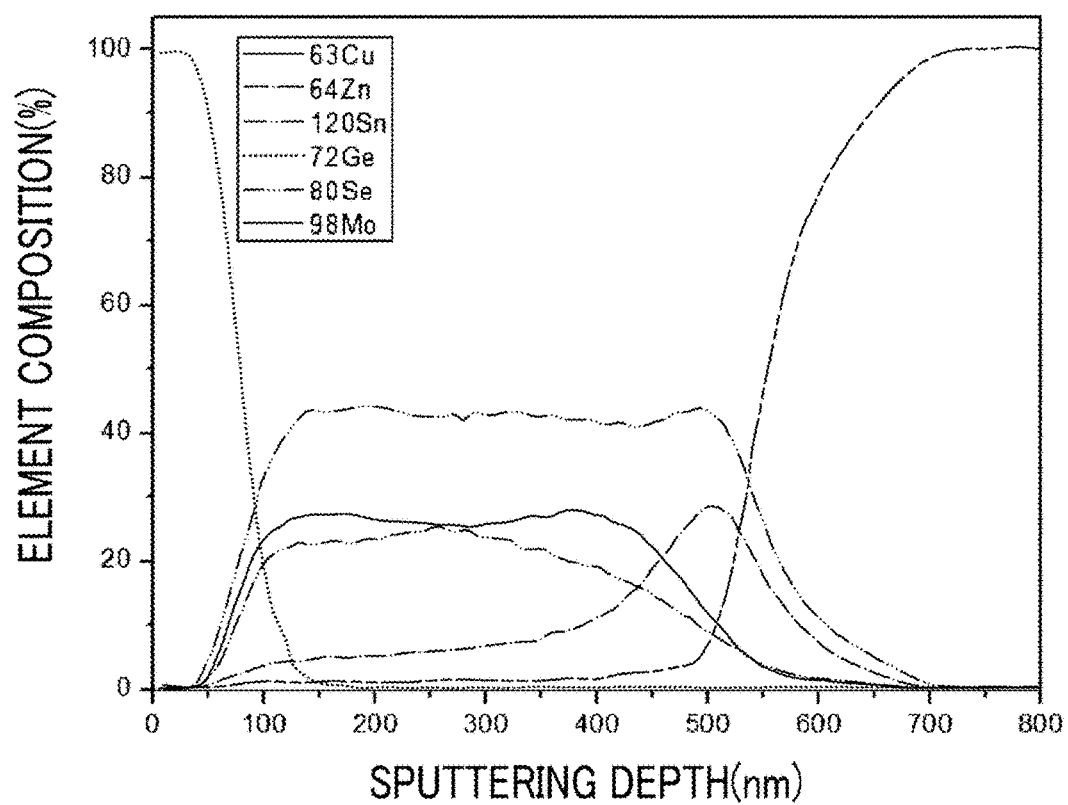

While the CZTSe-based thin film prepared in Example 4 was etched by sputtering, an element composition was measured according to a depth (Secondary ion mass spectroscopy, IMS-4FE7). A result thereof was as shown in FIG. 7. The measurement was carried out using a $Cs^+$ ion gun under conditions including impact energy of 5.5 keV, a current of 20 mA, and an analysis area of 33 μm. On the surface, Ge was present in substitution for Sn, and a large amount of Se was included in the center. At the interface, a large amount of S was present and an amount of Se was decreased. Cu and Zn were uniformly distributed overall. Distribution of Se and Cu in a small amount on the surface was a measure to improve the performance of a p-n junction.

According to the element composition according to a depth in the CZTGSe-based thin film prepared in Example, it can be seen from FIG. 8A to FIG. 8D that as a heat treatment time increased, a diffusion rate of Ge distributed on the surface toward the CZTSe light absorbing layer increased (Ge diffusion depth=about 100 nm). Therefore, it is possible to control a depth of band gap grading by adjusting the heat treatment time. Accordingly, it is possible to reduce a ratio of recombination and also possible to improve an open-circuit voltage by controlling the depth of band gap grading.

Experimental Example 4

X-Ray Diffraction and Raman Spectroscopy Analysis

Figure 9:
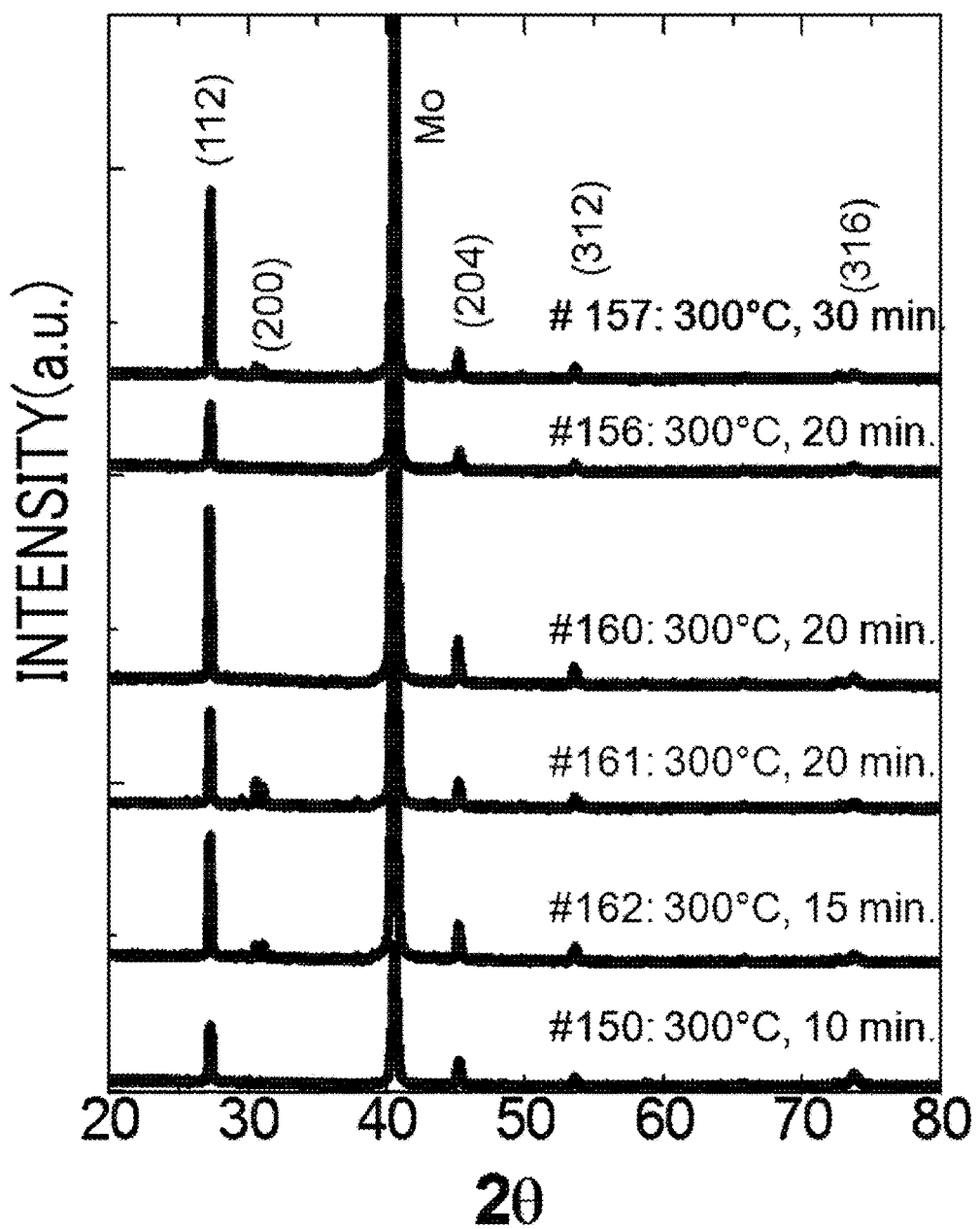
FIG. 9 is a spectrum showing an X-ray diffraction analysis result of a CZTSe-based composite thin film in accordance with an example of the present disclosure.
Figure 10A:
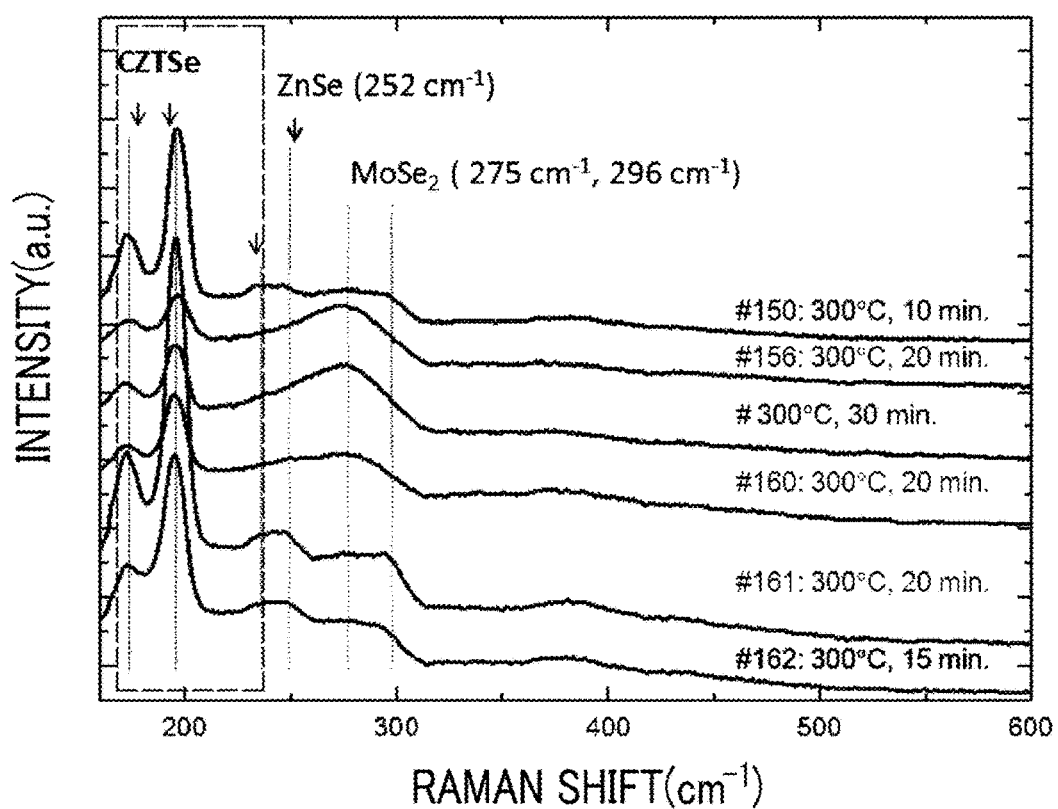
FIG. 10A to FIG. 10D are spectrums showing Raman spectroscopy analysis results of a CZTSe-based composite thin film in accordance with an example of the present disclosure.
Figure 10B:
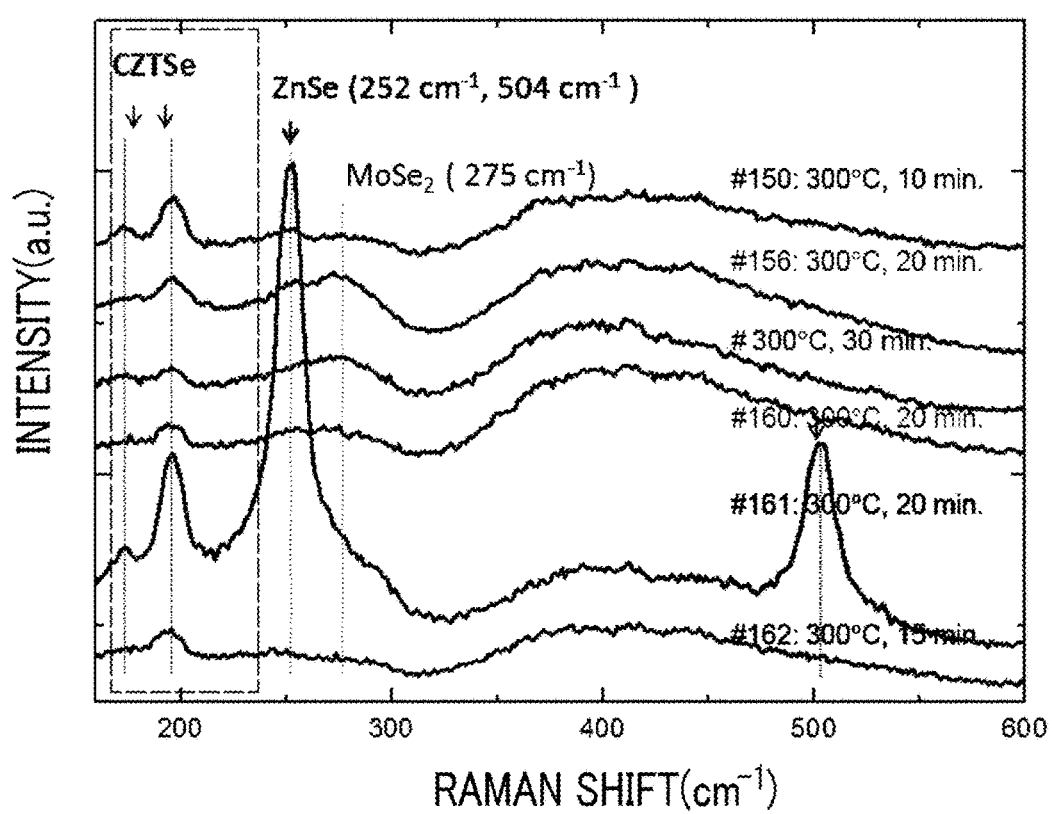
Figure 10C:
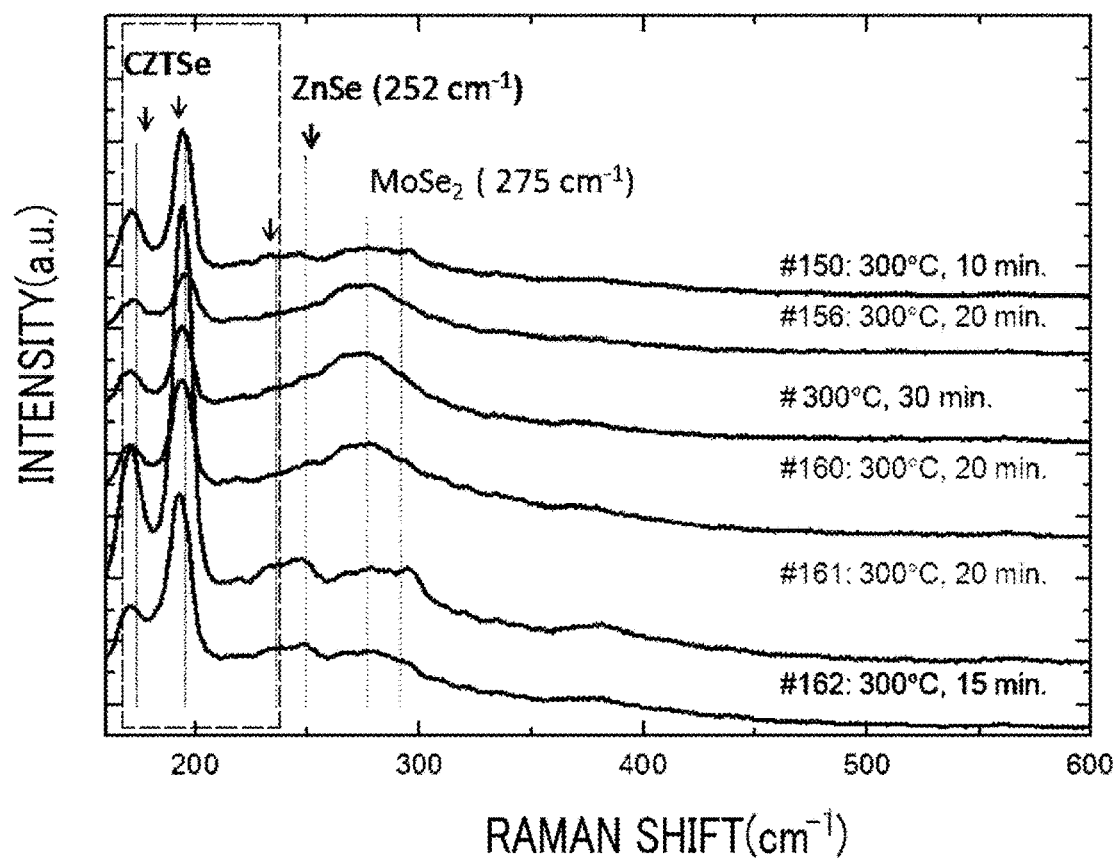
Figure 10D:
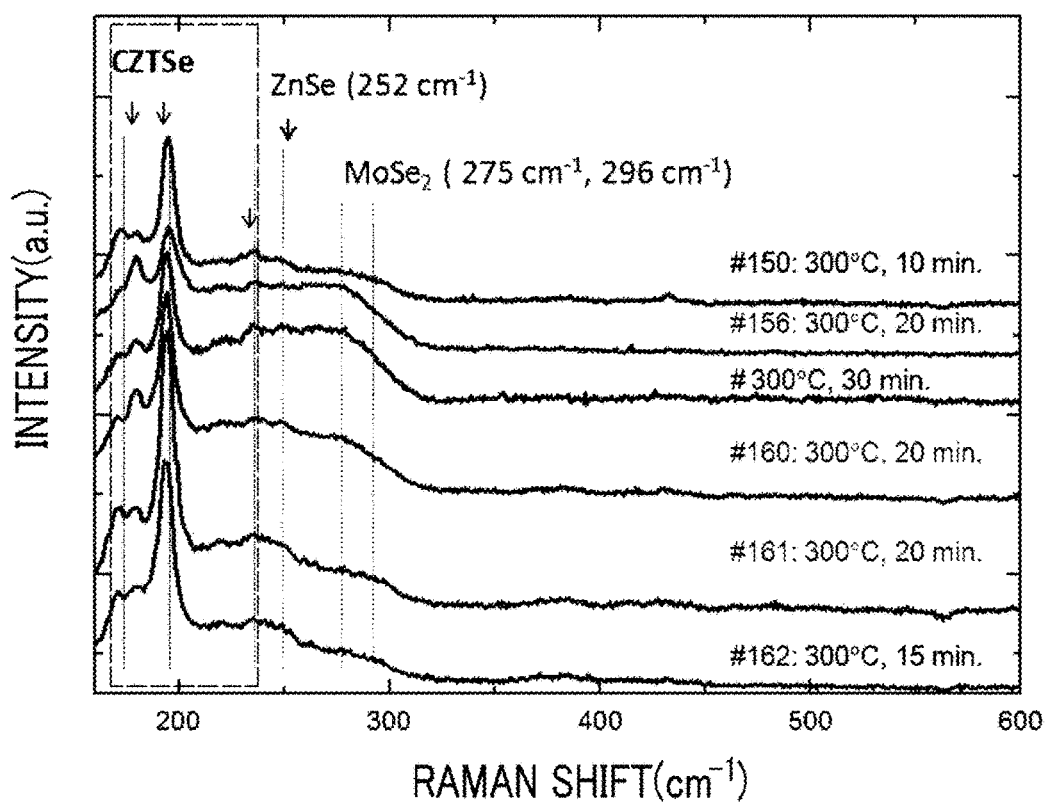

FIG. 9 is an XRD result showing crystallinity of a thin film [X-ray diffraction—New D8 Advance, Bruker]. It can be seen that since a CZTSe phase appeared in (112), (200)/(204), (312), and (316) directions, the thin film was properly formed of CZTSe. From FIG. 10A to FIG. 10D showing a Raman spectrum measurement result [Raman Spectroscopy—McPherson 207 spectrometer equipped with a nitrogen-cooled charged-coupled device (CCD)], it was confirmed that a CZTSe phase was uniformly distributed when a laser wavelength was varied (observation was conducted at various depths of penetration), and it was observed that a main peak of CZTSe had a high intensity at 300° C. between 10 minutes and 20 minutes. Further, it was confirmed that since a peak of CZTSe was not much changed according to a laser wavelength, a phase was properly formed, and it was observed that secondary phases such as $MoSe_2$ and ZnSe were present.

Example 5

Preparation of Solar Cell Using CZTSe-Based Composite Thin Film Including CZTGSe Thin Film A molybdenum (Mo) layer was coated to a thickness of 600 nm as a back electrode on a glass substrate. The $Cu_2ZnSnSe_4$ thin film and/or the $Cu_2Zn(Sn_{1-x},Ge_x)Se_4$ (CZ-TGSe) thin film prepared in the same manner as Example 4 was formed on the molybdenum layer, and a CdS layer as a buffer layer, an i-ZnO/Al—ZnO as a transparent electrode layer, and an Al layer as an electrode were laminated in sequence, so that a thin film solar cell was prepared.

Figure 13:
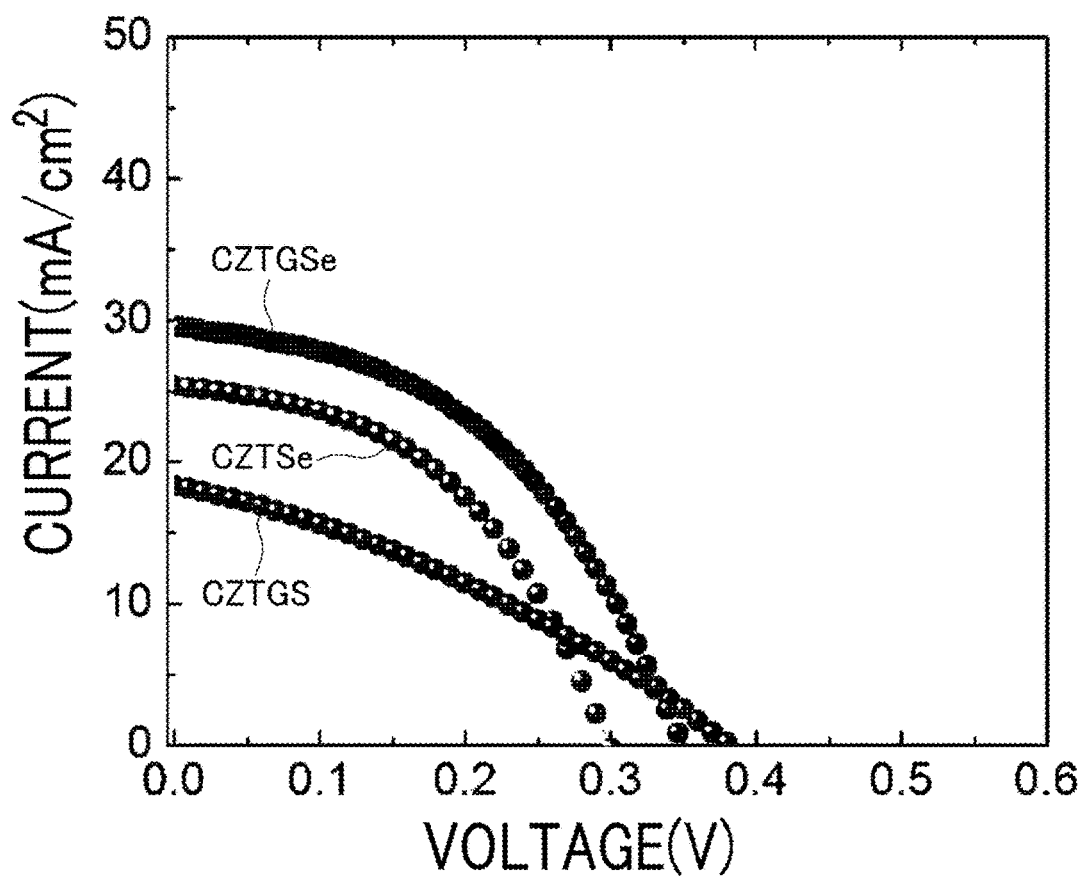
FIG. 13 is a graph showing a current-voltage relationship of a CZTSe-based composite thin film in accordance with an example of the present disclosure

Assuming that a solar cell using a conventional CZTSe thin film has the efficiency of about 3%, when grading is created using CZTGS, a band gap on a front surface is increased too much. Thus, it can be seen that an open-circuit voltage is improved but the efficiency is decreased due to a decrease in a short-circuit current and a curve factor. Meanwhile, it can be seen that a CZTSe-based composite thin film including CZTGSe achieves a voltage improvement and reduces a current loss, and, thus, achieves the efficiency of about 4% or more which is improved by 25% as compared with the conventional CZTSe thin film (see FIG. 13).

If a solar cell is optimized by creating band gap grading, it is possible to decrease reduction of electron-hole interface recombination and suppress an efficiency loss caused by an electric field on a back surface through back grading and front grading of a conventional device. Thus, it is possible to achieve the efficiency of about 4% or more. In particular, unlike S grading in CIGSSe, it has not yet been reported that S grading in CZTGSSe is achieved. If a surface treatment is performed using Ge and/or Si as described in the present example, it is possible to further improve device characteristics than the conventionally known efficiency. In this regard, S changes a conduction band, whereas Ge changes a valence band. Therefore, it has the advantage of further reducing a conduction band offset than S grading, which is very advantageous in improving the efficiency. For this reason, even if S grading is successfully accomplished, theoretically, it is difficult to achieve efficiency improvement of 0.4% or more.

Accordingly, as described in the present embodiment, if a solar cell is optimized by creating band gap grading using Ge and/or Si, it is possible to achieve the efficiency of about 15% or more.

The above description of the present disclosure is provided for the purpose of illustration, and it would be understood by those skilled in the art that various changes and modifications may be made without changing technical conception and essential features of the present disclosure. Thus, it is clear that the above-described embodiments are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

This invention was made with Korean government support under Project No. 1415132277 sponsored by Ministry of Trade, Industry and Energy and managed by Korea Institute Energy Technology Evaluation and Planning (under Research Project Title: Technology Innovation Program for Knowledge Economy; Subject Title: Development of non-vacuum-based technology for the deposition of Cu—Zn—Sn—S—Se thin films for low-cost and high-efficiency thin film solar cells; Research period: Dec. 1, 2011 through Nov. 30, 2014) with the beneficiary of sponsorship being Korea Institute of Science and Technology.

We claim:

1. A method for preparing a CZTSe-based composite thin film, comprising:
    forming a $Cu_2ZnSnSe_4$ thin film on a substrate; and
    forming a metal component M-containing layer on the $Cu_2ZnSnSe_4$ thin film, followed by annealing to form a $Cu_2Zn(Sn_{1-x},M_x)Se_4$ thin film,
    wherein x is from 0.2 to 0.5 and the component M includes Ge and/or Si.

2. The method for preparing the CZTSe-based composite thin film of claim 1, wherein the $Cu_2ZnSnSe_4$ thin film is formed by co-evaporating a precursor including Cu, Zn, Sn, and Se; or
    the $Cu_2ZnSnSe_4$ thin film is formed by forming a precursor thin film by depositing a Cu-containing precursor, a Zn-containing precursor, and a Sn-containing precursor, followed by performing selenization of the precursor thin film.

3. The method for preparing the CZTSe-based composite thin film of claim 1, further comprising:
    performing selenization after forming the $Cu_2ZnSnSe_4$ thin film and $Cu_2Zn(Sn_{1-x},M_x)Se_4$ thin film.

4. The method for preparing the CZTSe-based composite thin film of claim 2, wherein the precursor thin film is deposited one or more times in order of Sn/Zn/Cu, Sn/Cu/Zn, Zn/Cu/Sn, Zn/Sn/Cu, Cu/Sn/Zn, or Cu/Zn/Sn.

5. The method for preparing the CZTSe-based composite thin film of claim 1, further comprising:
    forming a $Cu_2ZnSn(Se_{1-y},S_y)_4$ thin film below the $Cu_2ZnSnSe_4$ thin film, by using SnS as a Sn-containing precursor and/or ZnS as a Zn-containing precursor; or by further injecting a S-containing gas phase source, prior to forming the $Cu_2ZnSnSe_4$ thin film,
wherein $0 \leq y \leq 1$.

6. The method for preparing the CZTSe-based composite thin film of claim 1, wherein the metal component M-containing layer is prepared by depositing the metal M on a surface of the $Cu_2ZnSnSe_4$ thin film by a vacuum evaporation method; by decomposing and diffusing a metal component M-containing gas phase precursor; and/or by thermally treating the surface of the $Cu_2ZnSnSe_4$ thin film in the metal component M-containing atmosphere.

7. The method for preparing the CZTSe-based composite thin film of claim 1, wherein the $Cu_2ZnSnSe_4$ thin film is formed to a thickness of from 0.1 μm to 3 μm.

8. The method for preparing the CZTSe-based composite thin film of claim 6, wherein the metal component M-containing layer is limited to a thickness of from 10 nm to 1,500 nm on the surface of the $Cu_2ZnSnSe_4$ thin film.

9. A CZTSe-based composite thin film, comprising:
a $Cu_2ZnSnSe_4$ thin film layer; and
a $Cu_2Zn(Sn_{1-x},M_x)Se_4$ thin film formed on the $Cu_2ZnSnSe_4$ thin film,
wherein x is from 0.2 to 0.5 and the component M includes Ge and/or Si.

10. The CZTSe-based composite thin film of claim 9, further comprising:
a $Cu_2ZnSn(Se_{1-y},S_y)_4$ thin film below the $Cu_2ZnSnSe_4$ thin film,
wherein $0 \leq y \leq 1$.

11. The CZTSe-based composite thin film of claim 9, wherein a band gap of the $Cu_2Zn(Sn_{1-x},M_x)Se_4$ thin film is higher than that of the $Cu_2ZnSnSe_4$ thin film.

12. A method for preparing a solar cell using a CZTSe-based composite thin film, comprising:
forming a back electrode on a substrate; and
forming a light absorbing layer including a CZTSe-based composite thin film prepared by a method according to any one of claim 1 on the back electrode.

13. A solar cell using a CZTSe-based composite thin film, comprising:
a substrate;
a back electrode on the substrate; and
a light absorbing layer including a CZTSe-based composite thin film according to any one of claim 9 formed on the back electrode.

* * * * *